United States Patent
Koumoto et al.

(10) Patent No.: US 7,060,582 B2
(45) Date of Patent: Jun. 13, 2006

(54) ADJUSTING THE GERMANIUM CONCENTRATION OF A SEMICONDUCTOR LAYER FOR EQUAL THERMAL EXPANSION FOR A HETERO-JUNCTION BIPOLAR TRANSISTOR DEVICE

(75) Inventors: Takeyoshi Koumoto, Tokyo (JP); Hideo Yamagata, Kanagawa (JP)

(73) Assignee: Sony Corporation, Tokyo (JP)

( * ) Notice: Subject to any disclaimer, the term of this patent is extended or adjusted under 35 U.S.C. 154(b) by 73 days.

(21) Appl. No.: 10/480,061

(22) PCT Filed: Jun. 4, 2002

(86) PCT No.: PCT/JP02/05512

§ 371 (c)(1),
(2), (4) Date: Dec. 5, 2003

(87) PCT Pub. No.: WO02/099890

PCT Pub. Date: Dec. 12, 2002

(65) Prior Publication Data

US 2004/0198010 A1    Oct. 7, 2004

(30) Foreign Application Priority Data

Jun. 5, 2001    (JP) .............................. 2001-169927

(51) Int. Cl.
*H01L 21/331* (2006.01)
(52) U.S. Cl. ...................... 438/309; 438/312; 438/933; 438/938; 257/183; 257/197; 257/565
(58) Field of Classification Search .................. 438/47, 438/309, 312, 317, 320, 335, 339, 341, 343, 438/353, 357, 358, 362–364, 369, 370, 378, 438/933, 938; 257/12, 183, 187, 197, 198, 257/423, 274, 477, 565, 575, 576

See application file for complete search history.

(56) References Cited

U.S. PATENT DOCUMENTS 4,062,034 A  *  12/1977  Matsushita et al. ........... 257/52
(Continued)

FOREIGN PATENT DOCUMENTS

DE    69508506    3/1996
EP    0551185    7/1993

(Continued)

OTHER PUBLICATIONS

Schonenberg, K.; "The Stability of $Si_{1-x}Ge_x$ Strained Layers on Small-Area Trench-Isolated Silicon"; Feb. 1997; Journal of Materials Research; vol. 12, No. 2; pp. 364-370.

*Primary Examiner*—Michael Lebentritt
*Assistant Examiner*—Stanetta Isaac
(74) *Attorney, Agent, or Firm*—Sonnenschein Nath & Rosenthal LLP

(57) ABSTRACT

The present invention relates to a semiconductor layer applicable to a hetero-junction bipolar transistor, a forming method thereof, and a semiconductor device and a manufacturing method thereof, for example. The semiconductor layer and the forming method thereof according to the present invention includes a first SiGe film or SiGeC film containing Ge of which the concentration become equal to a thermal expansion coefficient of silicon oxide and a second SiGe film or SiGeC film formed on the first film. In a semiconductor device according to the present invention and a manufacturing method thereof, first and second layers are laminated on an oxide film having an opening, and the first layer has the substantially same thermal expansion coefficient as that of the oxide film and has a thermal expansion coefficient different from that of the second layer. Thus, a stress that is caused by a difference between the thermal expansion coefficients becomes difficult to occur in the laminated film, and hence the occurrence of misfit dislocation can be suppressed. Thus, the present invention is suitable as the application to a hetero-junction bipolar transistor.

26 Claims, 21 Drawing Sheets

U.S. PATENT DOCUMENTS

| | | | |
|---|---|---|---|
| 4,551,394 A * | 11/1985 | Betsch et al. | 428/641 |
| 5,281,834 A * | 1/1994 | Cambou et al. | 257/200 |
| 5,698,890 A * | 12/1997 | Sato | 257/592 |
| 6,020,245 A * | 2/2000 | Sato | 438/309 |
| 6,030,884 A * | 2/2000 | Mori | 438/455 |
| 6,191,006 B1 * | 2/2001 | Mori | 438/455 |
| 6,210,988 B1 * | 4/2001 | Howe et al. | 438/50 |
| 6,399,993 B1 * | 6/2002 | Ohnishi et al. | 257/370 |

FOREIGN PATENT DOCUMENTS

| | | |
|---|---|---|
| EP | 0701287 | 3/1996 |
| EP | 1065728 | 1/2001 |
| JP | 5-182980 | 7/1993 |
| JP | 7-22330 | 1/1995 |
| JP | 7-254568 | 3/1995 |
| JP | 8-83805 | 3/1996 |
| JP | 2001-68479 | 3/2001 |
| KR | 10325 | 12/1998 |

* cited by examiner

ADJUSTING THE GERMANIUM CONCENTRATION OF A SEMICONDUCTOR LAYER FOR EQUAL THERMAL EXPANSION FOR A HETERO-JUNCTION BIPOLAR TRANSISTOR DEVICE

TECHNICAL FIELD

The present invention relates to a semiconductor layer containing a silicon germanium (SiGe) film or a silicon germanium carbon (SiGeC) film and a forming method thereof and a semiconductor device and a manufacturing method thereof.

BACKGROUND OF THE INVENTION

In recent years, in accordance with the arrival of a multimedia era in which information, services, entertainment, communications and the like are united, need for transmitting data of a large data amount at a high speed is progressively increasing, and it is also requested that bipolar transistors can operate at a higher speed. In order to enable the bipolar transistor to operate at a higher speed, a width of a base layer has to decrease and its carrier concentration has to increase. However, when a base layer is formed by implanting ions of impurities, due to channeling of impurities caused when ions of impurities are implanted, it is difficult to realize the base width of less than 40 nm. Therefore, it has been considered to deposit a base layer on a silicon (Si) substrate by an epitaxial growth method.

However, even when the homogeneous-junction base layer is deposited on the substrate by an epitaxial growth method, if a carrier concentration of the base layer increases, then holes that are to be implanted into the emitter from the base increases so that a current gain decreases. For this reason, there is considered a hetero-junction bipolar transistor in which a base layer containing a silicon germanium ($Si_{1-x}Ge_x$, hereinafter referred to as a "SiGe") film having a band gap width narrower than that of the Si film is deposited on a single crystal Si substrate by an epitaxial growth method, injections of holes into the emitter being considerably decreased by utilizing a fact that a potential barrier relative to holes is higher than a potential barrier relative to electrons.

In the hetero-junction bipolar transistor, a base resistance can be decreased by increasing a carrier concentration of the base, and a sufficiently large current amplification width ($h_{FE}$) can be obtained. As a result, while a sufficiently large withstand voltage is being maintained, a high frequency characteristic can be realized.

However, since Si and Ge have different lattice constants and thermal expansion coefficients, a stress occurs in the base layer containing SiGe. As a consequence, during a manufacturing process of heterojunction bipolar transistor after the base layer has been formed, a crystal defect which is referred to as a "misfit dislocation" occurs in the base layer so that a yield of the hetero-junction bipolar transistor is lowered. Because the misfit dislocation strongly depends on the Ge concentration in the SiGe, if the Ge concentraton is lowered, then it is possible to suppress the occurrence of the misfit dislocation. However, according to the above-mentioned proposal, effects for narrowing the width of the band gap of the base layer also decrease so that a hetero-junction bipolar transistor having desired performance cannot be obtained.

As another countermeasure for suppressing the occurrence of such misfit dislocation, it has been reported that the use of silicon germanium carbon ($Si_{1-x-y}Ge_xC_y$, hereinafter referred to as a "SiGeC") in which a very small amount of carbon (C) is added to SiGe is effective ("CVDSi$_{1-x-y}$Ge$_x$C$_y$, epitaxial growth and doping control", pp. 32–37, Subcommittee of The Society of Applied Physics, Silicon Technology No. 18, 23$^{rd}$ Jun. 2000). This technique is based on the fact that a distortion caused by a difference between lattice constants of Si and Ge can be alleviated by adding C to SiGe.

Moreover, since SiGeC has a considerably high diffusion control effect for impurities such as boron (B) as compared with SiGe, SiGeC has another advantage that the hetero-junction bipolar transistor can obtain a steep B doping profile having a high concentration as compared with SiGe. This is effective for decreasing a base resistance ($R_b$) and reducing a base running time ($\tau_B$) and which is advantageous for improving a high frequency characteristic of the hetero-junction bipolar transistor.

However, when the base forming region is prescribed by a silicon oxide film formed on a substrate, if an SiGeC film that serves as a base layer communicating with a single crystal Si substrate exposed through an opening of this silicon oxide ($SiO_2$) film and the $SiO_2$ film is formed, then a stress that is caused by a difference between thermal expansion coefficients of the SiGeC film and the $SiO_2$ film occurs so that the misfit dislocation tends to occur.

Therefore, it is difficult to provide a semiconductor device containing a hetero-junction bipolar transistor at a high yield.

SUMMARY OF THE INVENTION

An object of the present invention is to provide a hetero-junction layer with excellent crystal quality and its deriving electrode, and it is another object of the present invention to provide a semiconductor device containing a hetero-junction bipolar transistor at a high yield.

A semiconductor layer according to the first invention comprises a first SiGe film or a first SiGeC film communicated with each other on a single crystal silicon substrate exposed through an opening of an insulating film formed on the single crystal silicon substrate and the insulating film, the first film being of single crystal and polycrystal on the exposed single crystal silicon substrate and the insulating film and the first film containing Ge having a concentration of which the thermal expansion coefficient is equal to or becomes close to that of the insulating film and a second SiGe film or a second SiGeC film communicated with each other on the first SiGe film or the first SiGeC film, the second film being of single crystal and polycrystal above the exposed single crystal silicon substrate and the insulating film and the second film having a Ge concentration different from that of the first SiGe film or the first SiGeC film.

A semiconductor layer forming method according to the first invention comprises a process for forming a first SiGe film or a first SiGeC film communicated with each other on a single crystal silicon substrate exposed through an opening of an insulating film formed on the single crystal silicon substrate and the insulating film, the first film being of single crystal and polycrystal on the exposed single crystal silicon substrate and the insulating film and the first film containing Ge having a concentration in which a thermal expansion coefficient is equal to or becomes close to that of the insulating film and a process for forming a second SiGe film or a second SiGeC film communicated with each other on the first SiGe film or the first SiGeC film, the second film being of single crystal and polycrystal above the exposed single crystal silicon substrate and the insulating film and the second film having the Ge concentration different from that of the first SiGe film or the first SiGeC film.

A semiconductor device according to the second invention comprises an insulating film provided on a substrate, a first layer interconnected to the substrate through an opening formed on this insulating film and a second layer formed on this first layer, wherein the first layer is formed so as to contact with the insulating film and the substrate, the first layer having a thermal expansion coefficient that is substantially the same as that of the insulating film and the second layer having a thermal expansion coefficient different from that of the first layer.

A semiconductor device manufacturing method according to the second invention comprises a process for forming an insulating film on a substrate, a process for forming an opening on the insulating film, a process for forming a first semiconductor film with a thermal expansion coefficient substantially equal to that of the insulating film on the opening and a process for forming a second semiconductor film with a thermal expansion coefficient different from that of the first semiconductor film on the first semiconductor film.

A semiconductor device according to the third invention comprises a first SiGe film or a first SiGeC film communicated with each other in a single crystal silicon substrate exposed through an opening of an insulating film that prescribes a base forming region of a bipolar transistor, the first film being of single crystal and polycrystal on the exposed single crystal silicon substrate and the insulating film and the first film containing Ge of which the concentration becomes equal to a thermal expansion coefficient of the insulating film and a second SiGe film or a second SiGeC film being communicated with each other on the first SiGe film or the first SiGeC film, the second film being of single crystal or polycrystal above the exposed single crystal silicon substrate and the insulating film.

A semiconductor device manufacturing method according to the third invention comprises a process for forming a first SiGe film or a first SiGeC film communicated with each other on a single crystal silicon substrate exposed through an opening of an insulating film provided on the single crystal silicon substrate and which prescribes a base forming region of a bipolar transistor and the insulating film, the first film being of single crystal and polycrystal on the exposed single crystal silicon substrate and the insulating film and the first film containing Ge of which the concentration is equal to or becomes close to a thermal expansion coefficient of the insulating film and a process for forming a second SiGe film or a second SiGeC film communicated with each other on the first SiGe film or the first SiGeC film, the second film being of single crystal and polycrystal above the exposed single crystal silicon substrate and the insulating film and the second film having a Ge concentration different from that of the first SiGe film or the first SiGeC film.

The first layer or the first semiconductor film may contain at least Ge and the second layer or the second semiconductor layer may contain Ge and C. The first layer or the first semiconductor film may be made of SiGe, and the second layer or the second semiconductor film may be made of SiGeC. The first layer or the first semiconductor film may be made of SiGeC, and the second layer or the second semiconductor film may be made of SiGeC of which the Ge concentration is different from that of the SiGeC. The first layer or the first semiconductor film may be made of SiGe, and the second layer or the second semiconductor film may be made of SiGe of which the Ge concentration is different from that of the SiGe. The insulating film may be formed as the oxide film.

The Ge concentration in the first SiGe film or the first SiGeC film, the first film or the first semiconductor film should preferably be made constant in the film or layer thickness direction in a range of from 4 to 10 atomic %.

In the above-described manufacturing method, monosilane ($SiH_4$) gas may be used as a raw material of silicon, germanium ($GeH_4$) gas may be used as a raw material of germanium and methyl silane ($SiCH_6$) gas may be used as a raw material of carbon, respectively. When the present invention is applied to a bipolar transistor, the bipolar transistor may be manufactured in such a manner that a base layer may be formed by patterning a laminated film including the above-described first and second semiconductor films and into which impurities have been introduced, an emitter region being formed within this base layer.

Since the semiconductor layer and the forming method thereof according to the first invention uses the first SiGe film or the first SiGeC film containing the Ge having the concentration in which the thermal expansion coefficient is equal to or becomes close to that of the insulating film, the stress that causes the misfit dislocation can be decreased. Not only the thermal expansion coefficients become equal to each other between this insulating film and the first SiGe film or the first SiGeC film but also the sudden change of the thermal expansion coefficient between the first SiGe film or the first SiGeC film and the second SiGe film or the second SiGeC film having the different Ge concentration can be alleviated. Accordingly, the single crystal semiconductor layer can be formed as the hetero-junction layer, the polycrystal semiconductor layer can be formed as the deriving electrode for the heterojunction layer, and the stress that has been caused by the difference between the thermal expansion coefficients can be made difficult to occur in the semiconductor layer. Therefore, the occurrence of the misfit dislocation can be suppressed in the hetero-junction layer during the manufacturing process of the semiconductor device after the semiconductor layer has been formed, and hence there can be provided the hetero-junction layer with the excellent crystal quality and its deriving electrode.

Since the semiconductor device according to the second invention and the manufacturing method thereof use the first layer of which the thermal expansion coefficient is substantially the same as that of the insulating film, it is possible to decrease the stress that causes the misfit dislocation. Not only this insulating film and the first layer have substantially the same thermal expansion coefficients but also the sudden change of the thermal expansion coefficient between the first layer and the second layer can be alleviated. Accordingly, the single crystal semiconductor layer can be formed as the hetero-junction base layer, the polycrystal semiconductor layer can be formed as the base deriving electrode, and the stress that is caused by the difference between the coefficients of thermal expansion can be made difficult to occur in the semiconductor layer. Therefore, the occurrence of the misfit dislocation can be suppressed in the hetero-junction base layer during the manufacturing process of the semiconductor device after the semiconductor layer has been formed, and hence the semiconductor device containing the hetero-junction bipolar transistor can be provide at a high yield.

Since the semiconductor device according to the third invention and the manufacturing method thereof use the first SiGe film or the first SiGeC film containing the Ge having the concentration in which the thermal expansion coefficient is equal to or becomes close to that of the insulating film, the stress that causes the misfit dislocation can be decreased. Not only the thermal expansion coefficients become equal to each other between this insulating film and the first SiGe film or the first SiGeC film but also the sudden change of the thermal expansion coefficient between the first SiGe film or the first SiGeC film and the second SiGe film or the second SiGeC film having the different Ge concentration can be alleviated. Accordingly, the single crystal semiconductor layer can be formed as the hetero-junction base layer, the polycrystal semiconductor layer can be formed as the base deriving electrode, and the stress that is caused by the difference between the coefficients of thermal expansion can be made difficult to occur in the semiconductor layer. Therefore, the occurrence of the misfit dislocation can be suppressed in the heterojunction base layer in the manufacturing process of the semiconductor device after the semiconductor layer has been formed, and hence the semiconductor device that contains the hetero-junction bipolar transistor can be provided at a high yield.

DETAILED DESCRIPTION OF THE PRESENTLY PREFERRED EMBODIMENTS

Embodiments of the present invention will be described below with reference to the drawings.

In order to facilitate the understanding of a hetero-junction bipolar transistor according to this embodiment, reference examples will be described.

A first example refers to a manufacturing process of an SiGe hetero-junction bipolar transistor in which SiGe films that are communicating with each other are simultaneously formed on a single crystal Si substrate exposed through an opening of a silicon oxide ($SiO_2$) film which prescribes a base forming region and the $SiO_2$ film to form a single crystal SiGe film on the Si substrate as a base layer, a polycrystal SiGe film on the $SiO_2$ film being formed as a base deriving electrode. In this case, since a stress caused by a difference among thermal expansion coefficients of Si, Ge and $SiO_2$ also occurs in addition to a stress caused by a difference between the above-mentioned physical properties of Si and Ge, a misfit dislocation tends to occur more easily.

Figure 1:
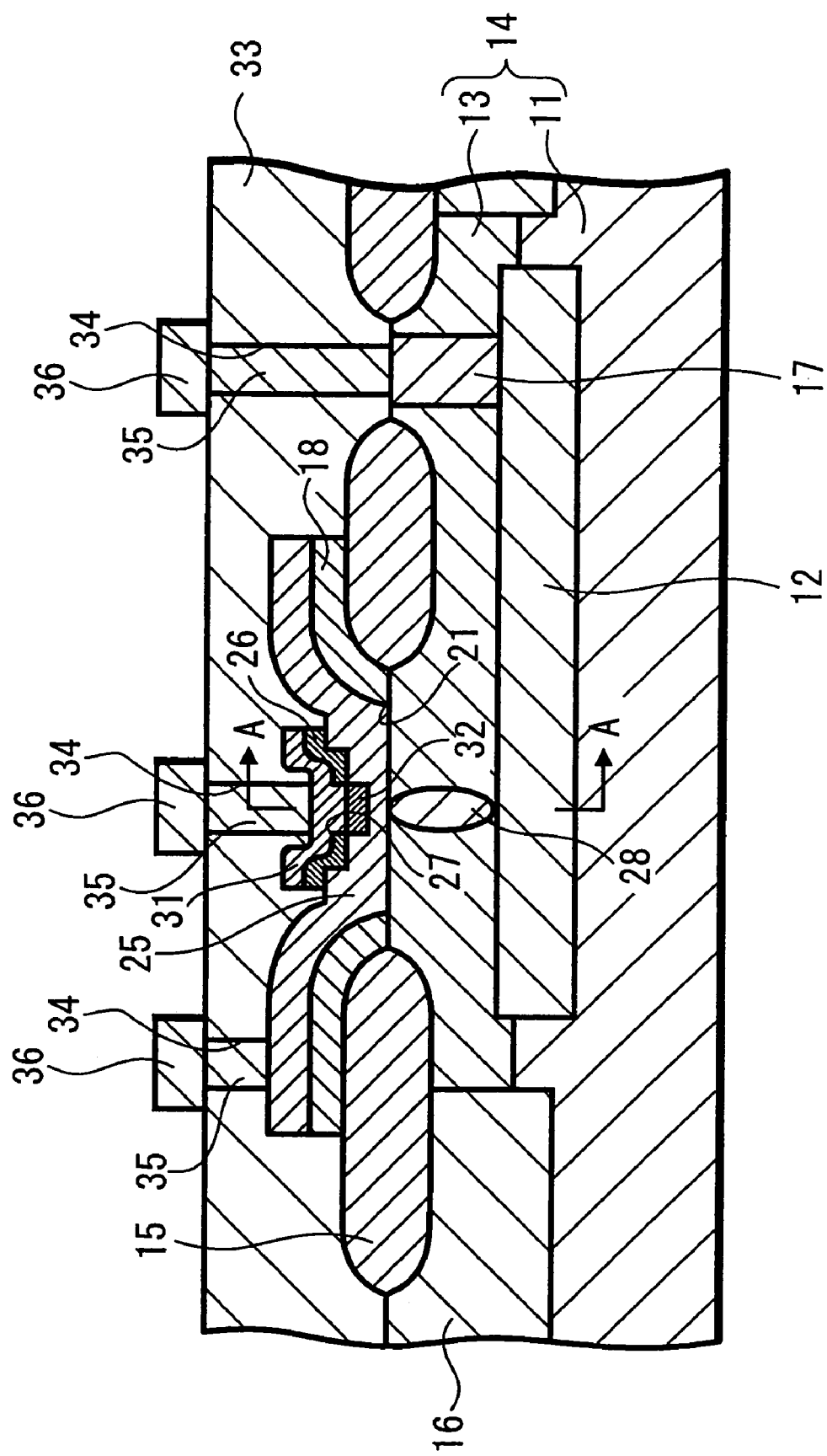
FIG. 1 is a cross-sectional view of a semiconductor device according to a second reference example.

FIGS. 1 to 5 show an NPN type SiGe hetero-junction bipolar transistor according to a second reference example and a manufacturing method thereof. As shown in FIG. 1, in order to manufacture this hetero-junction bipolar transistor, an $SiO_2$ film (not shown) is deposited on the surface of a P-type Si substrate 11 by thermal oxidation and an opening that prescribes a collector forming region is formed on the $SiO_2$ film. Then, an antimony oxide ($Sb_2O_3$) film is formed on the Si substrate exposed through the opening of the $SiO_2$ film and the $SiO_2$ film and Sb is diffused to the Si substrate 11 from the $Sb_2O_3$ film through the opening of the $SiO_2$ film by a solid-phase technique to form an $N^+$ region 12 as a collector. Thereafter, the $Sb_2O_3$ film and the $SiO_2$ film are removed.

Next, an N-type epitaxial layer 13 is deposited on the Si substrate 11 and the Si substrate 11 and the epitaxial layer 13 constitute an Si substrate 14. Then, an $SiO_2$ film 15 that serves as an element separation insulating film is formed by a LOCOS method and a $P^+$ region 16 that serves as an element separation region is formed by an ion implantation method. An $N^+$ region 17 that serves as a plug interconnected to the $N^+$ region 12 is deposited on a predetermined portion of the epitaxial layer 13. Thereafter, an $SiO_2$ film 18 is deposited by a CVD (chemical vapor deposition) method using tetraethoxy silane (TEOS) as a raw material gas and the $SiO_2$ film 18 is made dense by a heat treatment.

Next, a resist (not shown) is coated on the $SiO_2$ film 18 and the resist is processed so as to become a pattern having an opening corresponding to a base forming region by lithography. Then, an opening 21 is formed on the $SiO_2$ film 18 by an RIE (reactive ion etching) using this resist as a mask and the following wet etching. The RIE is carried out in order to increase dimension accuracy of the opening 21 and the like by its anisotropy, and the wet etching following the RIE is carried out in order suppress the surface of the Si substrate 14, which is exposed through the opening 21, from being damaged. Thereafter, the resist is removed from the $SiO_2$ film 18.

Next, in order to remove organic matter which is the residue of the resist attached to the surface of the Si substrate 14, the Si substrate 14 is rinsed by mixed solution of sulfuric acid and hydrogen peroxide which have been heated to a predetermined temperature. Moreover, in order to remove particles from the Si substrate 14, the Si substrate 14 is rinsed by mixed solution of ammonia water and hydrogen peroxide which have been heated to a predetermined temperature. Further, in order to remove metal pollutant and natural oxide film from the surface of the Si substrate 14, the Si substrate 14 is rinsed by dilute fluorine acid. While the silicon substrate is being rinsed by the dilute fluorine acid, a hydrogen passivation treatment also is carried out in which the exposed surface of the Si substrate 14 is ended by hydrogen.

Next, the Si substrate 14 is carried into a low pressure CVD system in order to carry out low-temperature epitaxial growth. At that time, first, the Si substrate 14 is carried into a load-lock chamber with vacuum evacuation function and the load-lock chamber is evacuated for a predetermined time period. Thereafter, without exposing the Si substrate 14 to the air, the Si substrate 14 is carried into a reaction chamber which is joined to the load-lock chamber. Then, while hydrogen gas is being introduced into the reaction chamber, the temperature of the Si substrate 14 is caused to rise up to about 900° C. and the silicon substrate is baked under the atmosphere of hydrogen gas for about 5 minutes. Thereafter, while the introduction of hydrogen gas into the reaction chamber is being continued, the temperature in the inside of the reaction chamber drops into approximately 660 to 710° C. and the following CVD is carried out.

Figure 2:
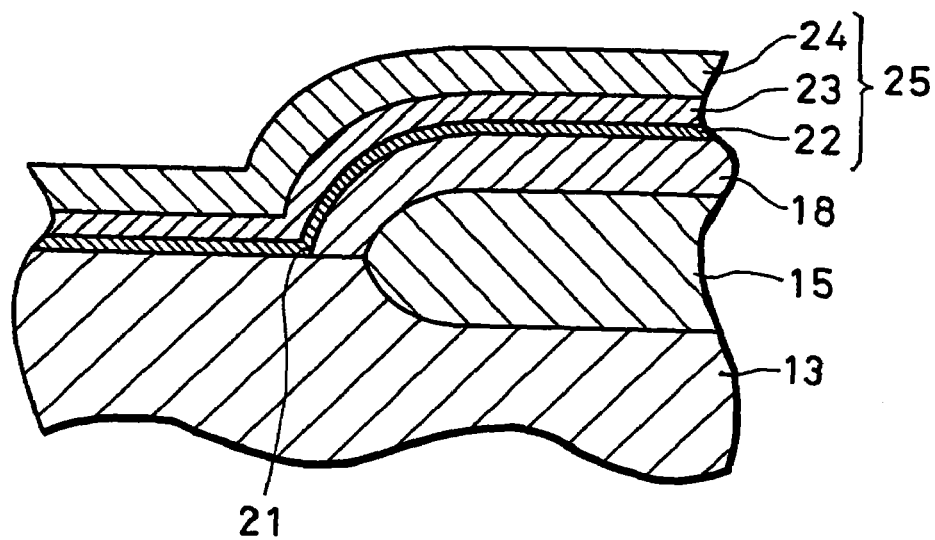
FIG. 2 is a partial cross-sectional view in a manufacturing process of the semiconductor device according to the second reference example.
Figure 4A:
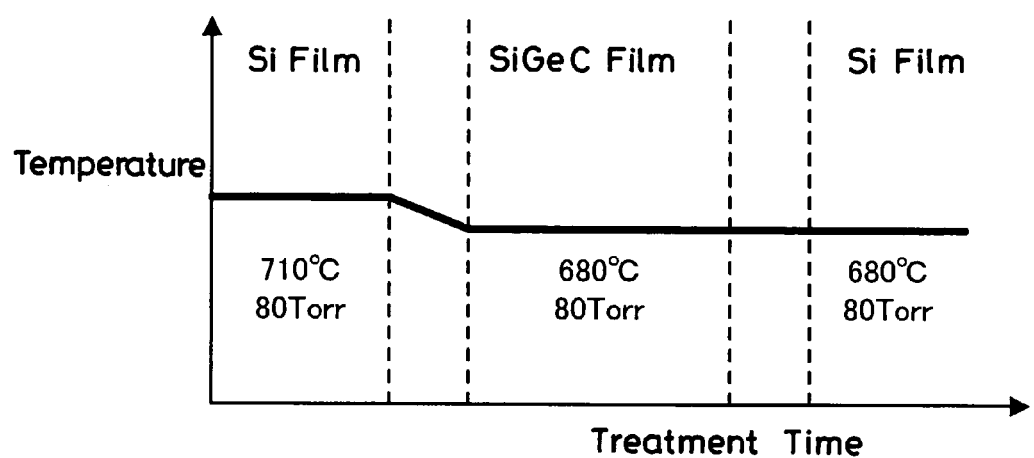
FIG. 4A is a time chart showing a forming method of a semiconductor layer according to a second reference example.

Specifically, as shown in FIG. 4(a), first, the temperature within the reaction chamber is set to about 710° C. and monosilane ($SiH_4$) gas with a partial pressure of 26.7 Pa (0.2 Torr) is supplied into the reaction chamber, whereby an Si film 22 having a thickness of 15 mm is deposited on the Si substrate 14 and the $SiO_2$ film 18 as shown in FIG. 2. A total pressure used at that time is 80 Torr and 79.8 Torr that is a difference between the total pressure and 0.2 Torr which is a partial pressure of $SiH_4$ gas is a partial pressure of hydrogen gas required when the silicon substrate is baked as described above.

Subsequently, the temperature within the reaction chamber drops into approximately 680° C., and an SiGeC film 23 is deposited on the Si film 22 by supplying $SiH_4$ gas, germanium ($GeH_4$) gas and methyl silane ($SiCH_6$) gas into the reaction chamber while controlling the flow rates of these gases such that a desired Ge concentration, a desired C concentration and a desired thickness may be obtained. At that time, diborane ($B_2H_6$) gas is supplied to the reaction chamber by controlling the flow rate thereof such that B (boron) gas may have a desired concentration profile in the SiGeC film 23. Subsequently, while the temperature within the reaction chamber is being held at about 680° C., an Si film 24 having a desired thickness with B added is deposited on the SiGeC film 23 by supplying $SiH_4$ gas and $B_2H_6$ ga into the reaction chamber.

Figure 3:
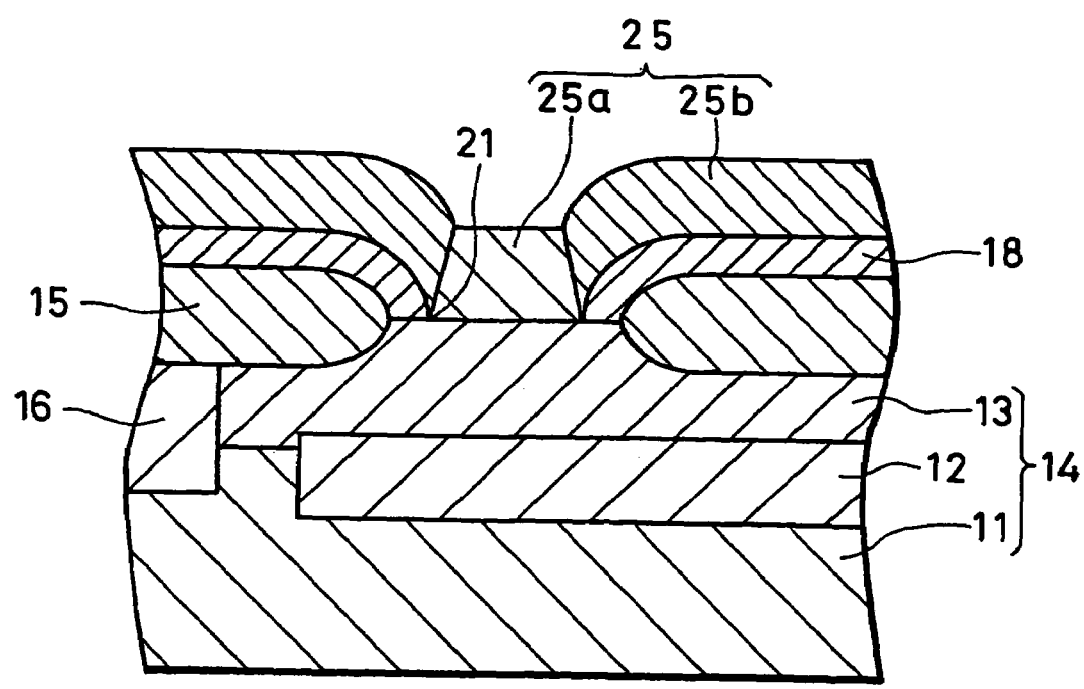
FIG. 3 is a partial cross-sectional view in a manufacturing process of the semiconductor device according to the second reference example.
Figure 4B:
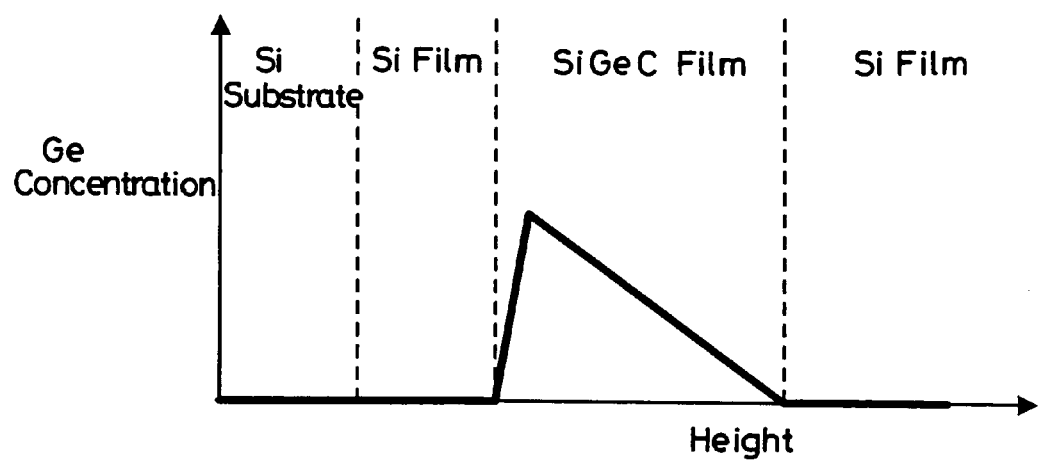
FIG. 4B is a graph showing a Ge concentration distribution in the height direction of the semiconductor layer according to the second reference example.

As a result of such CVD, as shown in FIG. 4B, a laminated film 25 composed of the Si film 22, the SiGeC film 23 and the Si film 24 and in which a Ge concentration distribution shape in the height direction is triangular is deposited on the Si substrate 14 and the $SiO_2$ film 18. Since the Si substrate 14 is exposed through the opening 21 of the $SiO_2$ film 18 before this CVD starts, as shown in FIG. 3, the laminated film 25 is composed of a single crystal film 25a at its portion on the exposed Si substrate 14 and a polycrystal film 25b at its portion on the $SiO_2$ film 18.

The Si film 22 in the laminated film 25 is used to smooth miniscule concavities and convexities on the surface of the Si substrate 14 exposed from the opening 21. The Si film 22 in the laminated film 25 is also used as a seed film required when the polycrystal film 25b is formed on the $SiO_2$ film 18. After the laminated film 25 has been formed as described above, the laminated film 25 and the $SiO_2$ film 18 are successively processed so as to have a base layer pattern and a base deriving electrode pattern by the lithography and the RIE.

Next, as shown in FIG. 1, an $SiO_2$ film 26 is deposited as an insulating film by a CVD method and the $SiO_2$ film 26 is made dense by a heat treatment. Then, an opening 27 corresponding to the emitter forming region is formed on the $SiO_2$ film 26 by the lithography and the RIE. Thereafter, while the resist on the $SiO_2$ film 26 is being used as a mask, a region 28 for canceling impurities on the collector side out from impurities of the base is formed under the opening 27 by implanting ions of phosphor. Then, the resist is removed from the $SiO_2$ 26.

Next, a polycrystal Si film 31 that functions as a conductive film and the impurity diffusing source is deposited by a CVD method, and ions of arsenic are implanted into this polycrystal Si film 31. Then, by the lithography and the RIE, the polycrystal Si film 31 and the $SiO_2$ film 26 are successively processed so as to have emitter electrode patterns, and the laminated film 25 is exposed. Thereafter, while the resist on the polycrystal Si film 31 is being used as a mask, ions of B for reducing resistance at the portion of the base deriving electrode are implanted into the laminated film 25. Then, the resist is removed from the polycrystal Si film 31.

Next, ions of impurities implanted into the SIC region 28, the polycrystal Si film 31 and the laminated film 25 are activated by a heat treatment, and an $N^+$ region 32 is formed as an emitter by diffusing ions of arsenic into the Si film 24 of the laminated film 25 from the polycrystal Si film 31 through the opening 27. Then, an $SiO_2$ film 33 is deposited as an interlayer insulator and an interconnection hole 34 that reaches the polycrystal Si film 31, the laminated film 25 and the $N^+$ region 17 is bored through the $SiO_2$ film 33 by the lithography and the RIE.

Figure 5:
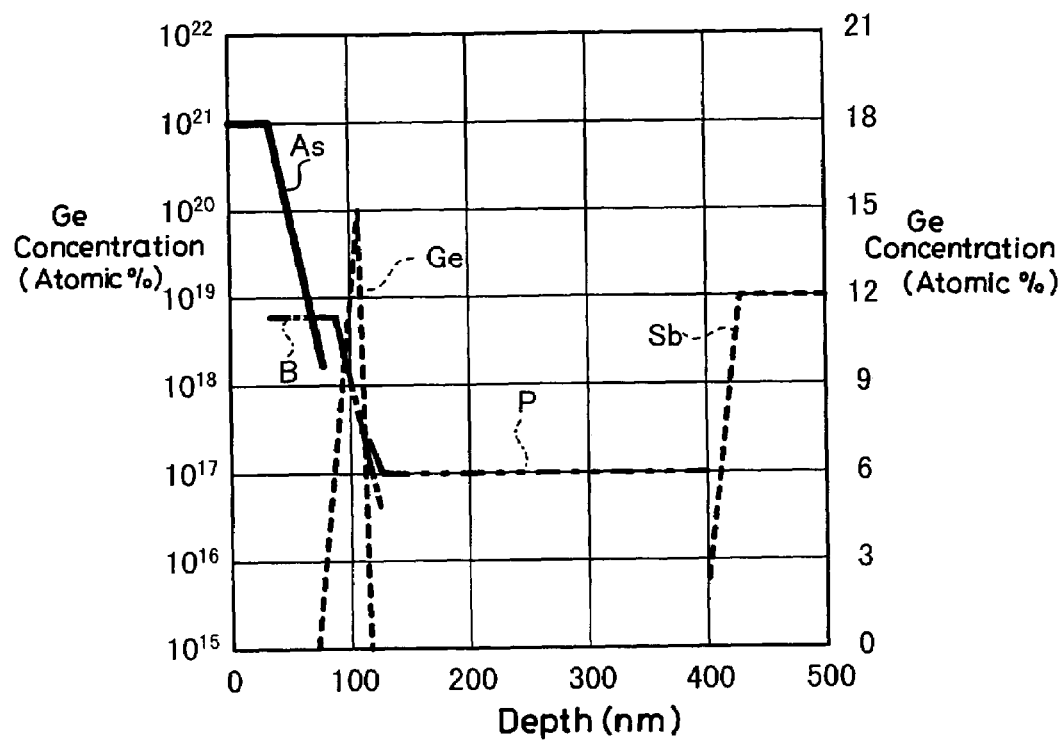
FIG. 5 is a graph showing concentration distributions of various kinds of impurities and Ge in the depth direction of the semiconductor device according to the second reference example.

Next, the interconnection hole 34 is filled with a plug 35 made of tungsten by a combination of a blanket CVD method and etching or a selective CVD method. Then, an Al alloy film 36, for example, is deposited by a sputtering method, for example, and the Al alloy film 36 is processed so as to have an emitter electrode interconnection pattern, a base electrode interconnection pattern and a collector electrode interconnection pattern by the lithography and the RIE. FIG. 5 shows concentration distributions of various kinds of impurities and Ge in the depth direction from the polycrystal Si film 31 to the $N^+$ region 12 of the hetero-junction bipolar transistor thus manufactured, i.e. concentration distributions taken along the line A—A in FIG. 1.

Figure 6:
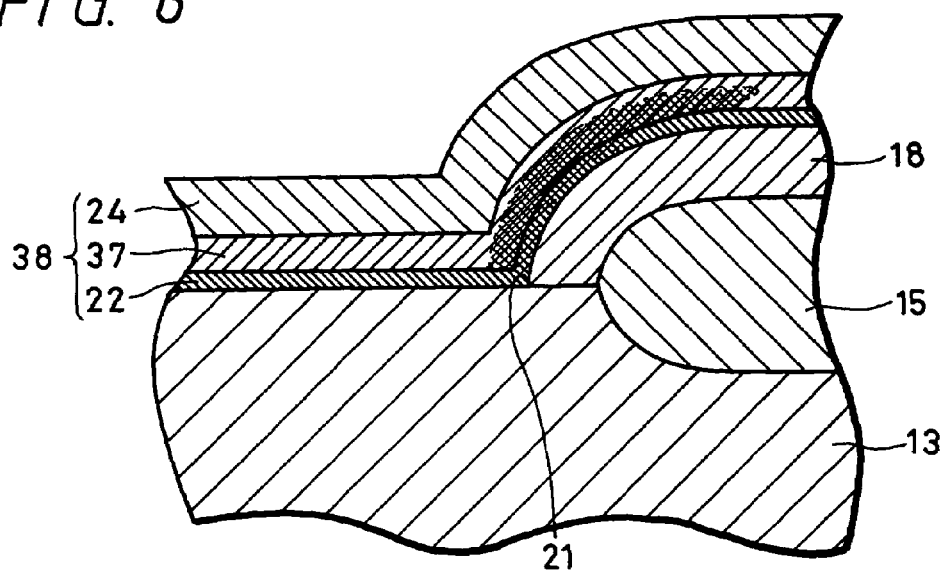
FIG. 6 is a partial cross-sectional view showing the situation in which a stress occurs in a semiconductor device according to a third reference example.

FIG. 6 shows a third reference example. This hetero-junction bipolar transistor comprises an SiGe film 37 instead of the SiGeC film 23 in the second reference example shown in FIGS. 1 and 2 and a laminated film 38 composed of the Si film 22, the SiGe film 37 and the Si film 24. A rest of arrangement is similar to that of FIG. 1. FIG. 5 shows the situation in which a stress occurs in the hetero-junction bipolar transistor of the third reference example. The SiGe film 37 is formed by omitting the addition of $SiCH_6$ gas from the raw material gas of the SiGeC film 23. As shown in FIG. 6, stresses occur near the boundary between the Si film 22 and the SiGe film 37 above the $SiO_2$ film 18 and near the interface between the $SiO_2$ film 18 and the Si film 22. In particular, stresses tend to concentrate near the end edge of the opening 21 that prescribes the base forming region. Then, these stresses cause the misfit dislocation to occur.

Although the lattice constants and the thermal expansion coefficients of Si and Ge are different from each other in the SiGe film 37 as already described, a lattice distortion may be alleviated in the SiGeC film 23 for use with the laminated film 25 by the addition of C. However, since both of the laminated films 25 and 38 have the Si film 22 deposited on the $SiO_2$ film 18, it may be considered that stresses of distribution similar to those of FIG. 6 to a certain extent occur in the hetero-junction bipolar transistor according to the second reference example having the laminated film 25.

Prior to the description of the embodiments of the present invention, the principle of the present invention will be described first.

In the laminated film 25 of the above-mentioned hetero-junction bipolar transistor according to the second reference example, since the SiGeC film 23 is laminated on the Si film 22, as shown in FIG. 5, the Ge concentration suddenly increases from 0 atomic % to 15 atomic % at the interface between these Si film 22 and SiGeC film 23.

Figure 7A:
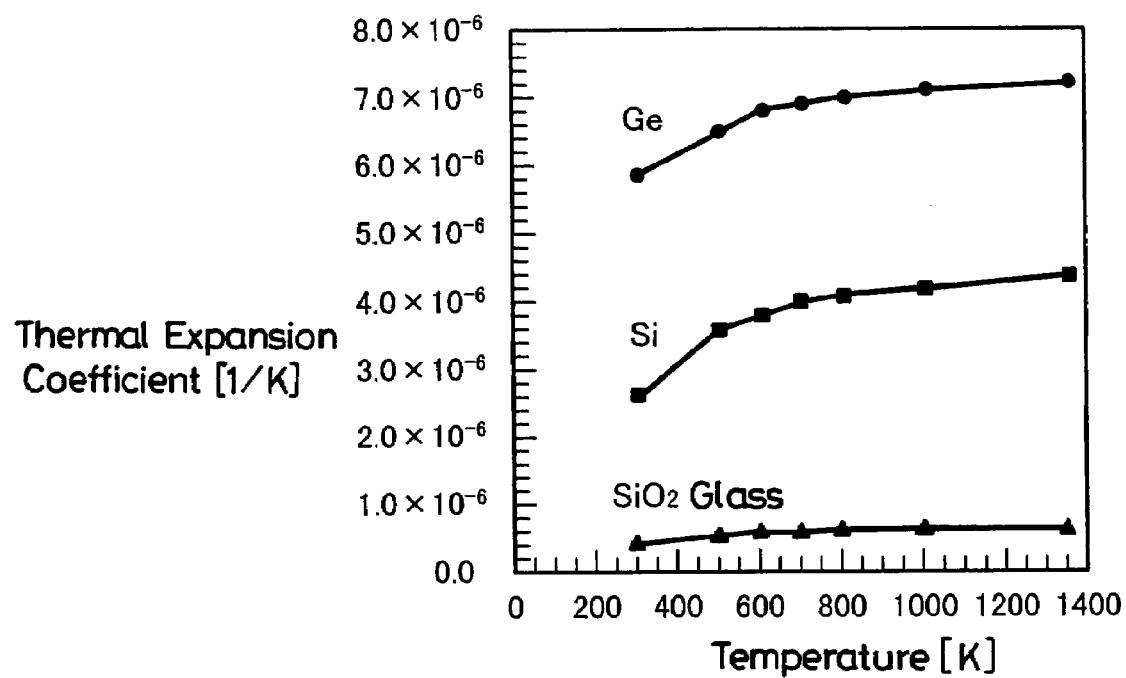
FIG. 7A is a graph to which reference will be made in explaining a principle of the present invention and illustrates a relationship between temperatures of various kinds of substances and thermal expansion coefficients.
Figure 7B:
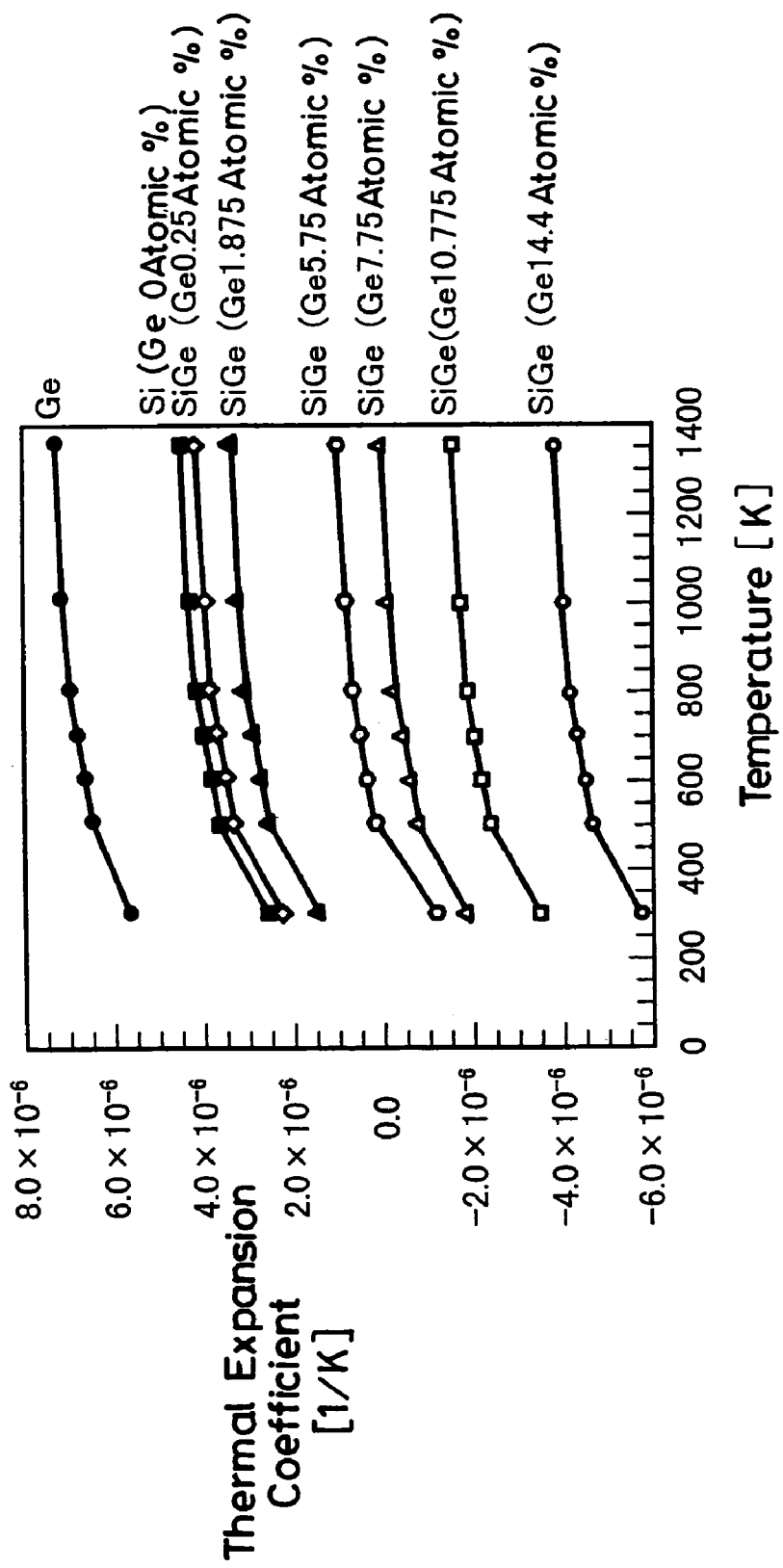
FIG. 7B is a graph to which reference will be made in explaining a principle of the present invention and illustrates a relationship between temperatures and thermal expansion coefficients obtained when a Ge concentration in SiGe is changed.

Therefore, as is clear from FIG. 7B, the thermal expansion coefficient near a room temperature, for example, suddenly changes from about $+2.5 \times 10^{-6}$ [1/K] (Ge concentration=0 atomic %, i.e.,) to about $-6.0 \times 10^{-6}$ [1/K] (Ge concentration=14.4 atomic %) along the negative direction at the interface between these Si film 22 and SiGeC film 23. In addition, as shown in FIG. 7A, since the value of the thermal expansion coefficient of $SiO_2$ is approximately zero, in particular, on the $SiO_2$ film 18 on which the opening 21 should be formed, the sudden change of the thermal expansion coefficient at the interface between the $SiO_2$ film 18 and the Si film 22 in the positive direction is added to the above-mentioned change of the thermal expansion coefficient in the negative direction.

Then, it may be considered that the stress caused by the difference between the thermal expansion coefficients is a factor that causes the misfit dislocation to occur in the laminated film 25 during the manufacturing process of the hetero-junction bipolar transistor after the laminated film 25 has been formed. However, as is clear from FIG. 7B, in the SiGe in which the Ge concentration falls within a range of from 4 to 10 atomic %, e.g. 7.75 atomic %, the value of the thermal expansion coefficient is approximately zero. Accordingly, in the embodiment that will be described later on, instead of the Si film 22 in the laminated film 25 of the hetero-junction bipolar transistor of the second reference example, there is used the SiGe film of which the Ge concentration falls within a range of from 4 to 10 atomic %, e.g. 7.75 atomic %.

As described above, if the SiGe film whose Ge concentration is 7.75 atomic % is used instead of the Si film 22, then the change of the thermal expansion coefficient at the interface between the $SiO_2$ film 18 and the SiGe film reaches a value close to zero, and the sudden change of the thermal expansion coefficient at the interface between the SiGe film and the SiGeC film 23 can be alleviated. As a result, the stress that is caused by the difference between the coefficients of thermal expansion is difficult to occur in the laminated film that functions as the base layer and the base deriving electrode, and the occurrence of misfit dislocation can be suppressed.

Next, an embodiment of the present invention that is applied to an NPN type SiGeC hetero-junction bipolar transistor and a manufacturing method thereof will be described with reference to manufacturing process diagrams of FIGS. 8 to 17.

Figure 8:
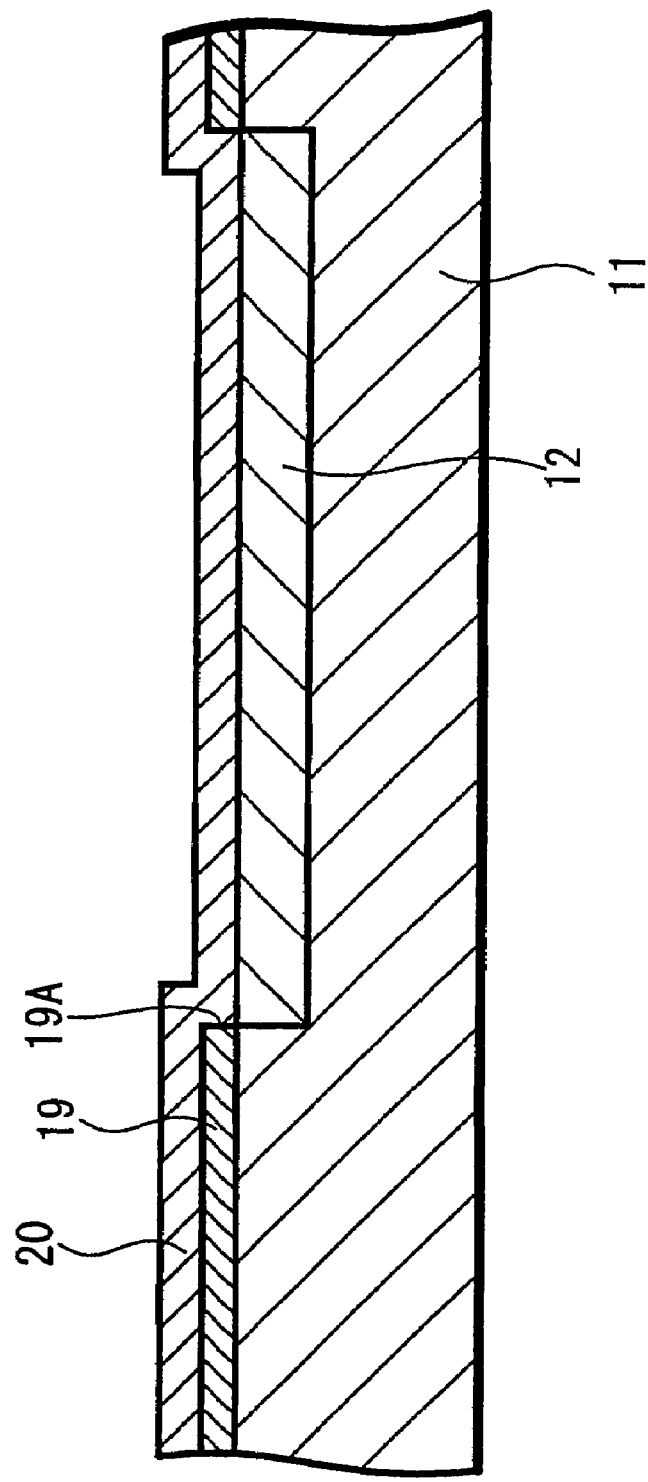
FIG. 8 is a manufacturing process diagram showing a manufacturing method of a semiconductor device according to an embodiment of the present invention (No. 1)

First, as shown in FIG. 8, an insulating film, in this embodiment, an $SiO_2$ film 19 is formed on the surface of a P-type Si substrate 11 by thermal oxidation, and an opening 19A that prescribes a collector forming region is formed on the $SiO_2$ film 19. Then, an N-type impurity containing film, in this embodiment, an antimony oxide ($Sb_2O_3$) film 20 is formed on the Si substrate 11 exposed through the opening 19A of the $SiO_2$ film 19 and the $SiO_2$ film 19, and an $N^+$ region 12 is formed as a collector by solid-phase-diffusing Sb into the Si substrate 11 through the opening 19A of the $SiO_2$ film 19 from the $Sb_2O_3$ film 20. Thereafter, the $Sb_2O_3$ film and the $SiO_2$ film are removed.

Figure 9:
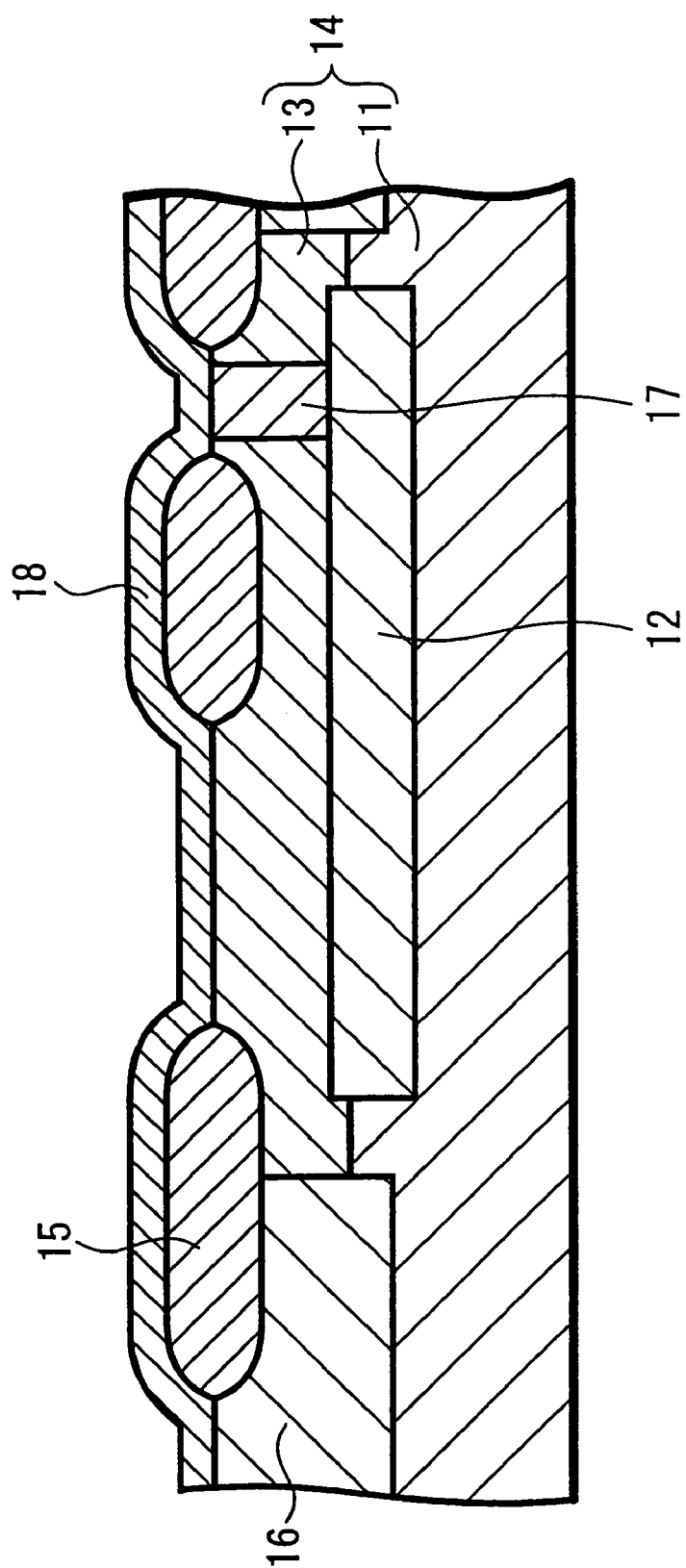
FIG. 9 is a manufacturing process diagram showing a manufacturing method of a semiconductor device according to an embodiment of the present invention (No. 2)

Then, as shown in FIG. 9, an N-type epitaxial layer 13 is formed on the Si substrate 11, and the Si substrate 11 and the epitaxial layer 13 constitute the Si substrate 14. Then, an $SiO_2$ film 15 is formed as an element separation insulating film by a LOCOS method, and a $P^+$ region 16 is formed as an element separation region by an ion implantation method. An $N^+$ region 17 that functions as a plug to be interconnected to the $N^+$ region 12 is formed in the epitaxial layer 13 at its predetermined portion. Then, an $SiO_2$ film 18 is deposited by a CVD (chemical vapor deposition) method using tetraethoxy silane (TEOS) as raw material gas, and the $SiO_2$ film 18 is made dense by a heat treatment.

Figure 10:
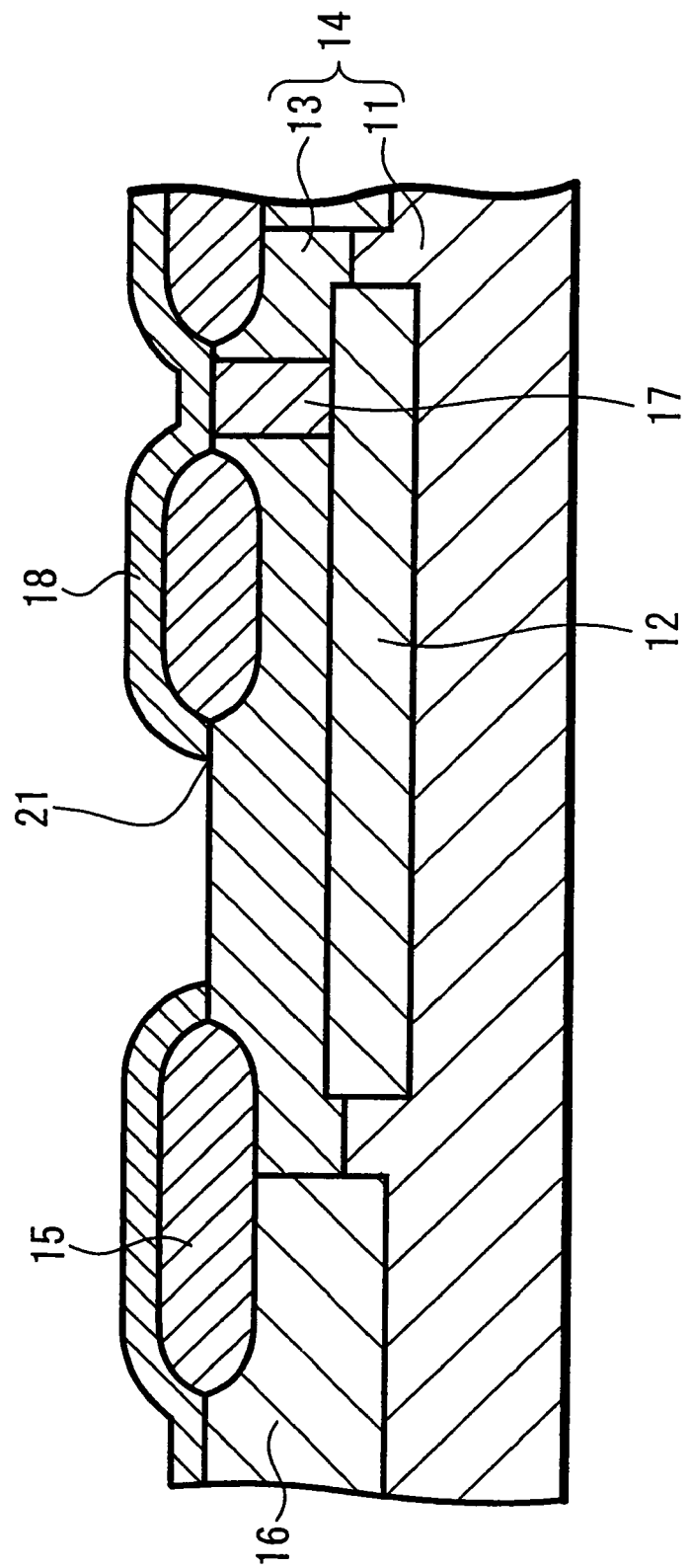
FIG. 10 is a manufacturing process diagram showing a manufacturing method of a semiconductor device according to an embodiment of the present invention (No. 3)

Next, as shown in FIG. 10, a resist (not shown) is coated on the $SiO_2$ film 18 and the resist is processed so as to have a pattern with an opening corresponding to a base forming region by the lithography. Then, an opening 21 is formed on the SiO$_2$ film 18 by the RIE (reactive ion etching) using this resist as a mask and the following wet etching. At that time, the RIE is carried out in order to increase dimension accuracy of the opening 21 and the lie by its anisotropy. The wet etching following the RIE is carried out to in order to suppress the surface of the Si substrate 14 exposed through the opening 21 from being damaged. Thereafter, the resist is removed from the SiO$_2$ film 18.

Next, in order to remove an organic matter that is a residue of the resist attached to the surface of the Si substrate 14, the Si substrate 14 is rinsed by mixed solution of sulfuric acid and hydrogen peroxide heated at a predetermined temperature, for example. Moreover, in order to remove particles from the Si substrate 14, the Si substrate 14 is rinsed by mixed solution of ammonia water and hydrogen peroxide heated at a predetermined temperature, for example. Further, in order to remove a metal pollutant and a natural oxide film from the surface of the Si substrate 14, the Si substrate 14 is rinsed by dilute hydrofluoric acid. When the Si substrate 1 is rinsed by dilute hydrofluoric acid, the hydrogen passivation treatment also is carried out and the exposed surface of the Si substrate 14 is ended by hydrogen.

Next, in order to carry out low-temperature epitaxial growth, the Si substrate 14 is carried into the low pressure CVD system. At that time, first, the Si substrate 14 is carried into the load-lock chamber having vacuum evacuation function, and the load-lock chamber has been evacuated for a predetermined time period. Thereafter, while the Si substrate 14 is being protected from being exposed to the air, the Si substrate 14 is carried into the reaction chamber connected the load-lock chamber. Then, while hydrogen gas is being introduced into the reaction chamber, the temperature of the Si substrate 14 is caused to rise up to about 900° C. and baked under atmosphere of hydrogen gas for about 5 minutes. Thereafter, while the introduction of hydrogen gas into the reaction chamber is being continued, the temperature within the reaction chamber drops into about 680° C. and the following CVD is carried out.

Figure 11:
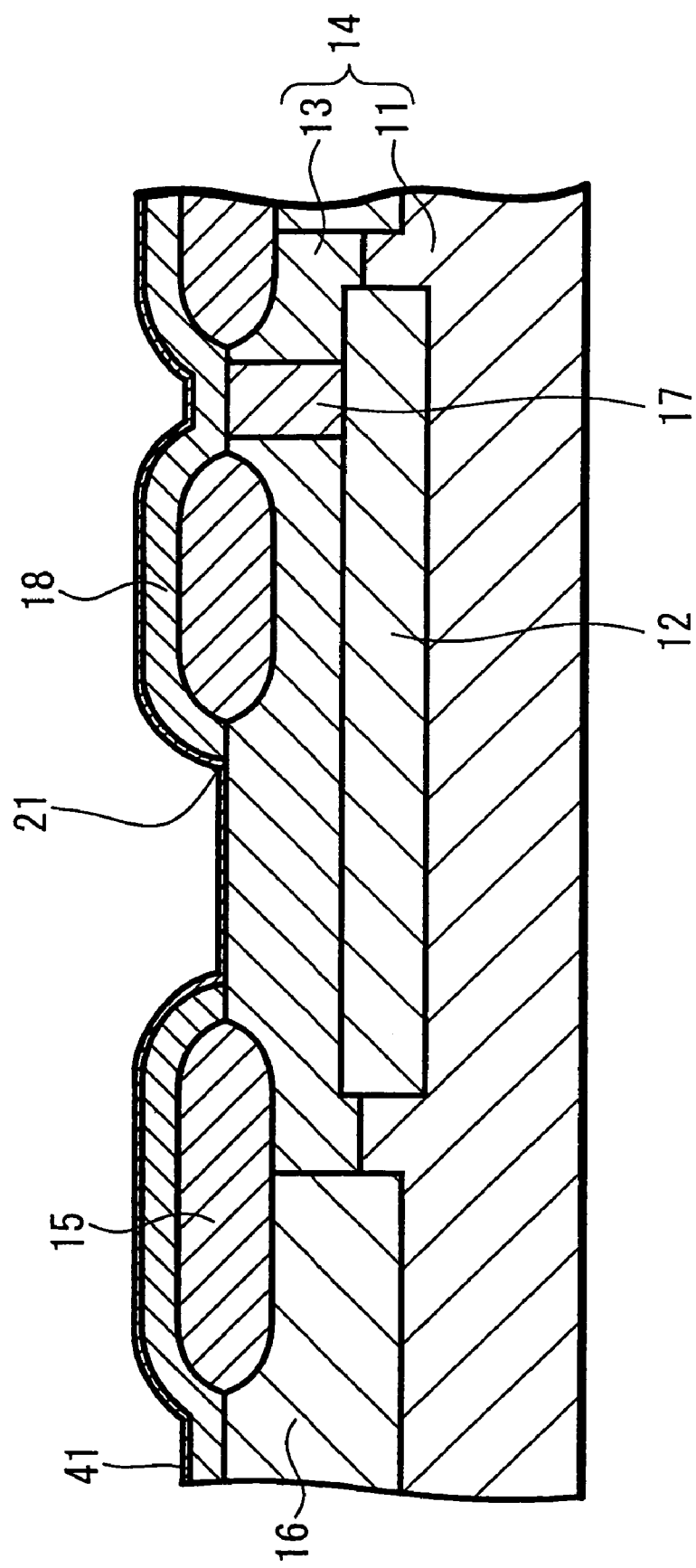
FIG. 11 is a manufacturing process diagram showing a manufacturing method of a semiconductor device according to an embodiment of the present invention (No. 4)
Figure 18A:
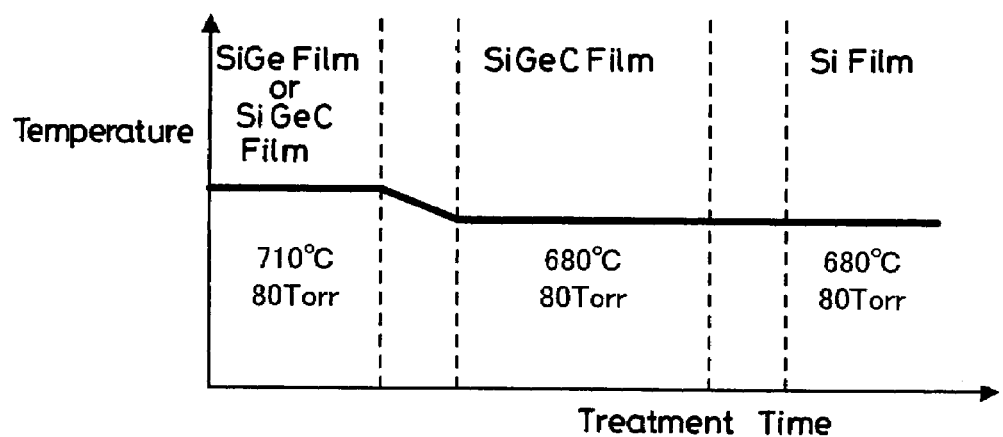
FIG. 18A is a time chart showing a semiconductor layer forming method according to an embodiment of the present invention.
Figure 19:
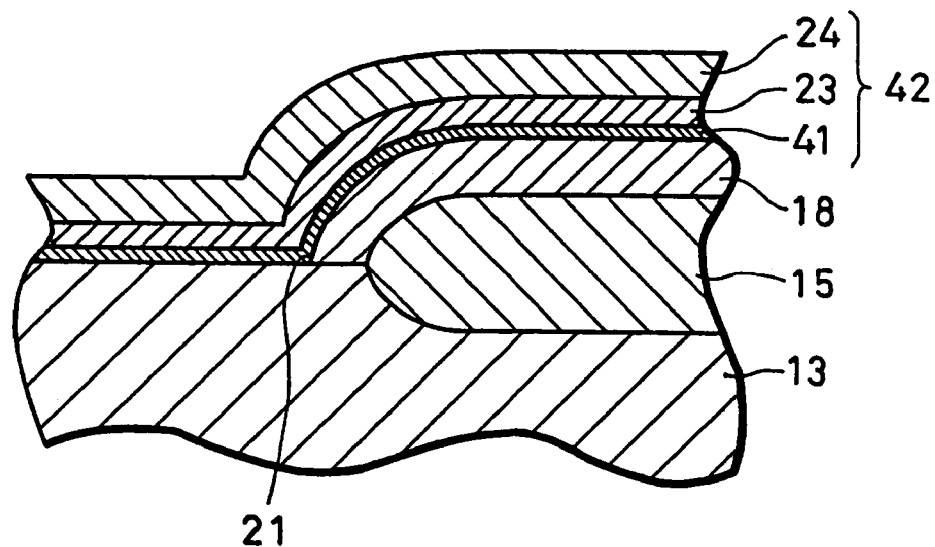
FIG. 19 is a partial cross-sectional view in a manufacturing process of a semiconductor device according to an embodiment of the present invention.

Specifically, as shown in FIG. 18A, first, the temperature within the reaction chamber is set to about 710° C. Then, while the pressure within the reaction chamber is being held at about 10666 Pa (80 Torr) and the flow rate of hydrogen gas is being held at the constant state of 20 SLM, an SiGe film 41 having a thickness ranging from 5 to 30 nm, e.g. about 15 nm is deposited on the Si substrate 14 and the SiO$_2$ film 18 by supplying SiH$_4$ gas of 20 sccm and GeH$_4$ of the amount whose Ge concentration in the film falls within a range of 4 to 10 atomic %, e.g. 7.75 atomic % into the reaction chamber as shown in FIGS. 11 and 19. The temperature obtained within the reaction chamber at that time may be the same temperature as that used when the next SiGeC film 23 is deposited (680° C. in this embodiment).

Figure 12:
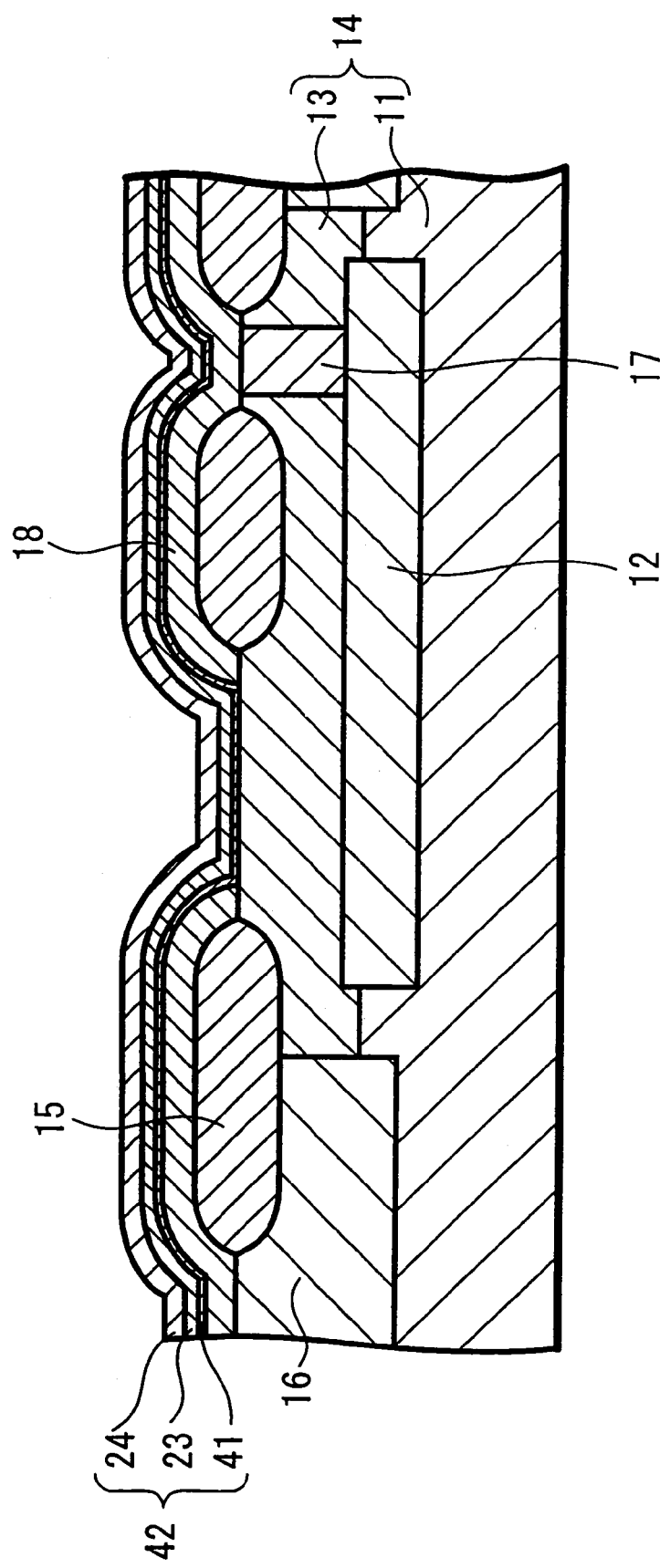
FIG. 12 is a manufacturing process diagram showing a manufacturing method of a semiconductor device according to an embodiment of the present invention (No. 5)
Figure 13:
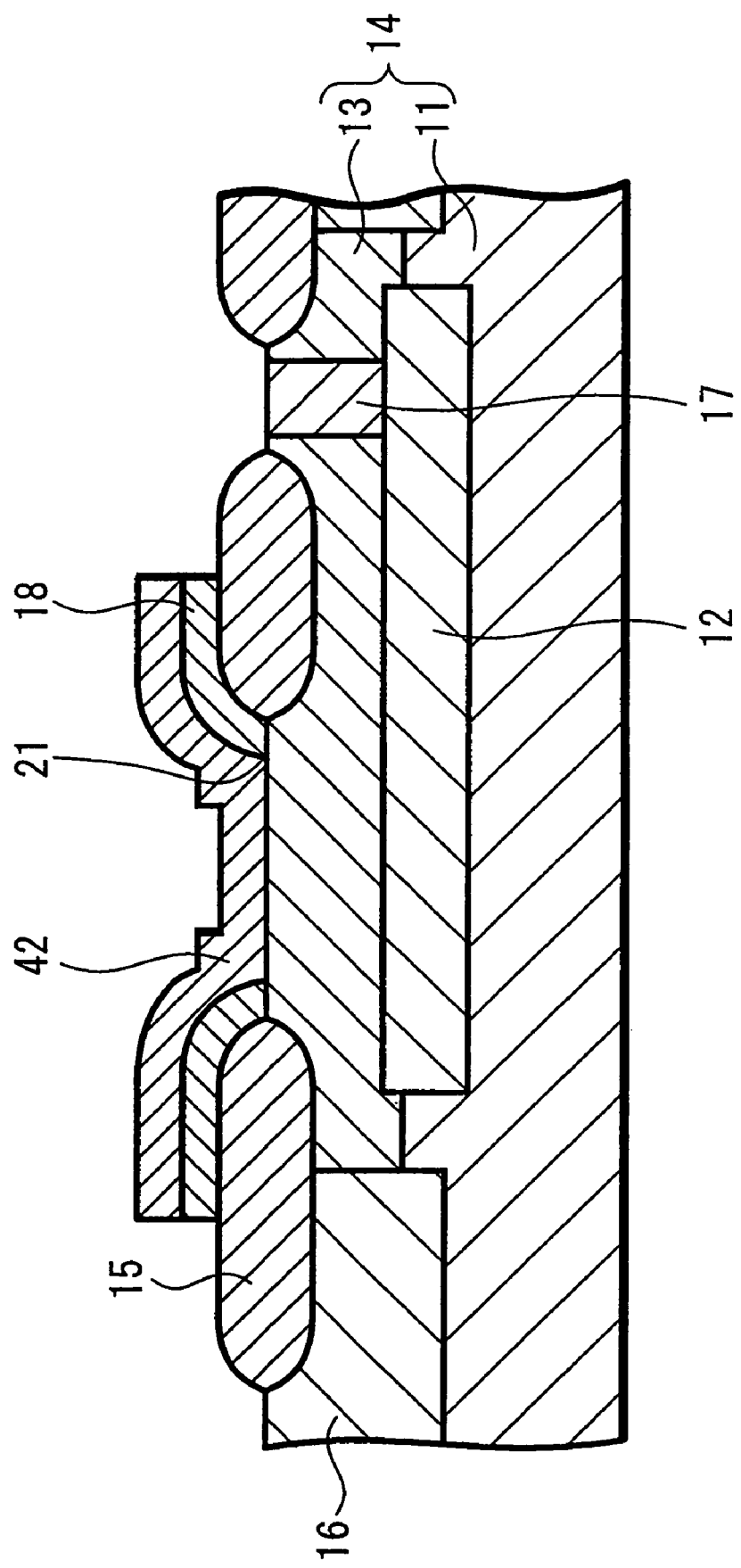
FIG. 13 is a manufacturing process diagram showing a manufacturing method of a semiconductor device according to an embodiment of the present invention (No. 6)

Subsequently, the temperature within the reaction chamber is caused to drop into about 680° C. and the SiGeC film 23 is deposited on the SiGe film 41 by supplying SiH$_4$ gas, germanium (GeH$_4$) gas and methyl silane (SiCH$_6$) gas into the reaction chamber while their flow rates are being controlled such that a desired Ge concentration, a desired C concentration and a desired film thickness may be obtained. At that time, diborane (B$_2$H$_6$) gas is supplied to the reaction chamber while its flow rate is being controlled such that B (boron) may have a desired concentration profile in the SiGeC film 23. Subsequently, while the temperature within the reaction chamber is being held at approximately 680° C.,
the Si film 24 having a desired thickness with B added thereto is deposited on the SiGeC film 23 by supplying the SiH$_4$ gas and the B$_2$H$_6$ gas into the reaction chamber. As shown in FIGS. 12 and 19, the SiGeC film 23 and the Si film 24 are sequentially laminated on this SiGe film 41 and thereby a laminated film 42 composed of these films is formed.

Figure 18B:
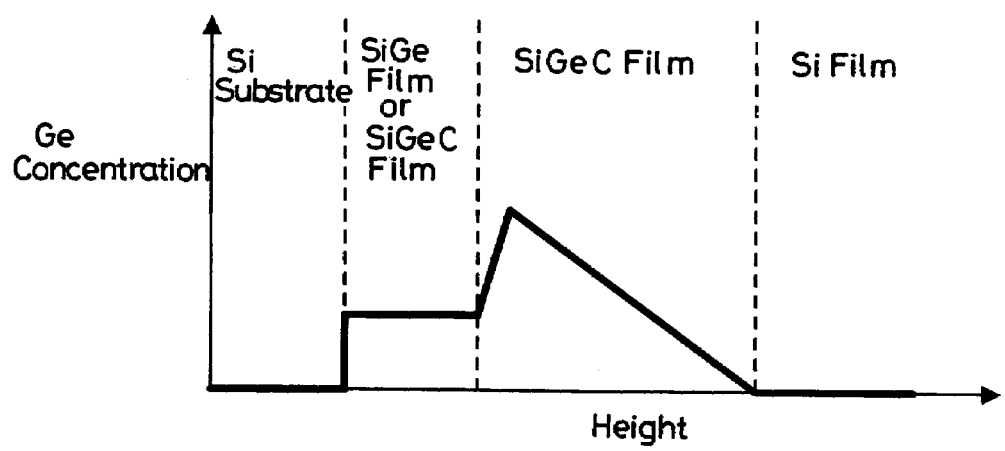
FIG. 18B is a graph of a Ge concentration distribution in the height direction of a semiconductor layer according to an embodiment of the present invention.
Figure 20:
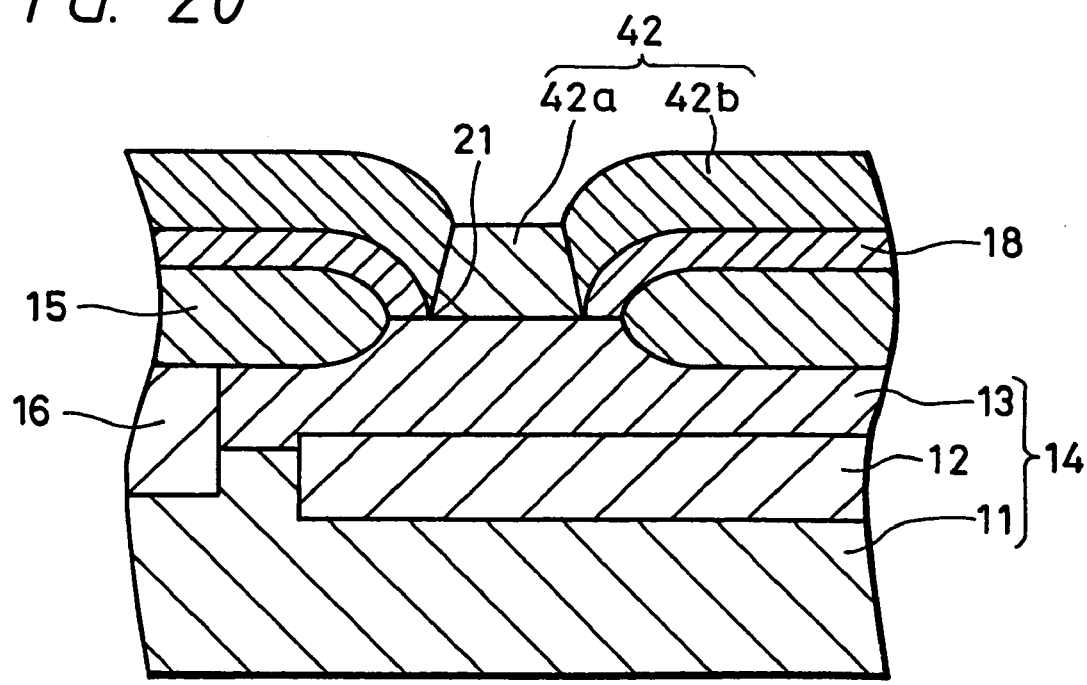
FIG. 20 is a partial cross-sectional view in a manufacturing process of a semiconductor device according to an embodiment of the present invention.

FIG. 18B shows a Ge concentration distribution shape in the height direction of this laminated film 42. As shown in FIG. 20, this laminated film 42 also has a single crystal film 42a formed at its portion on the Si substrate 14 exposed through the opening 21 and a polycrystal film 42b at its portion on the SiO$_2$ film 18.

The SiGe film 41 in the laminated film 42 is used in order to smooth miniscule concavities and convexities on the surface of the Si substrate 14 exposed from the opening 21. The SiGe film 41 in the laminated film 42 also is used as the seed film required when the polycrystal film 42b is formed on the SiO$_2$ film 18. After the insulating film 42 has been formed as described above, as shown in FIG. 13., the laminated film 42 and the SiO$_2$ film 18 are successively processed so as to have a base layer pattern and a base deriving electrode pattern by the lithography and the RIE.

Figure 14:
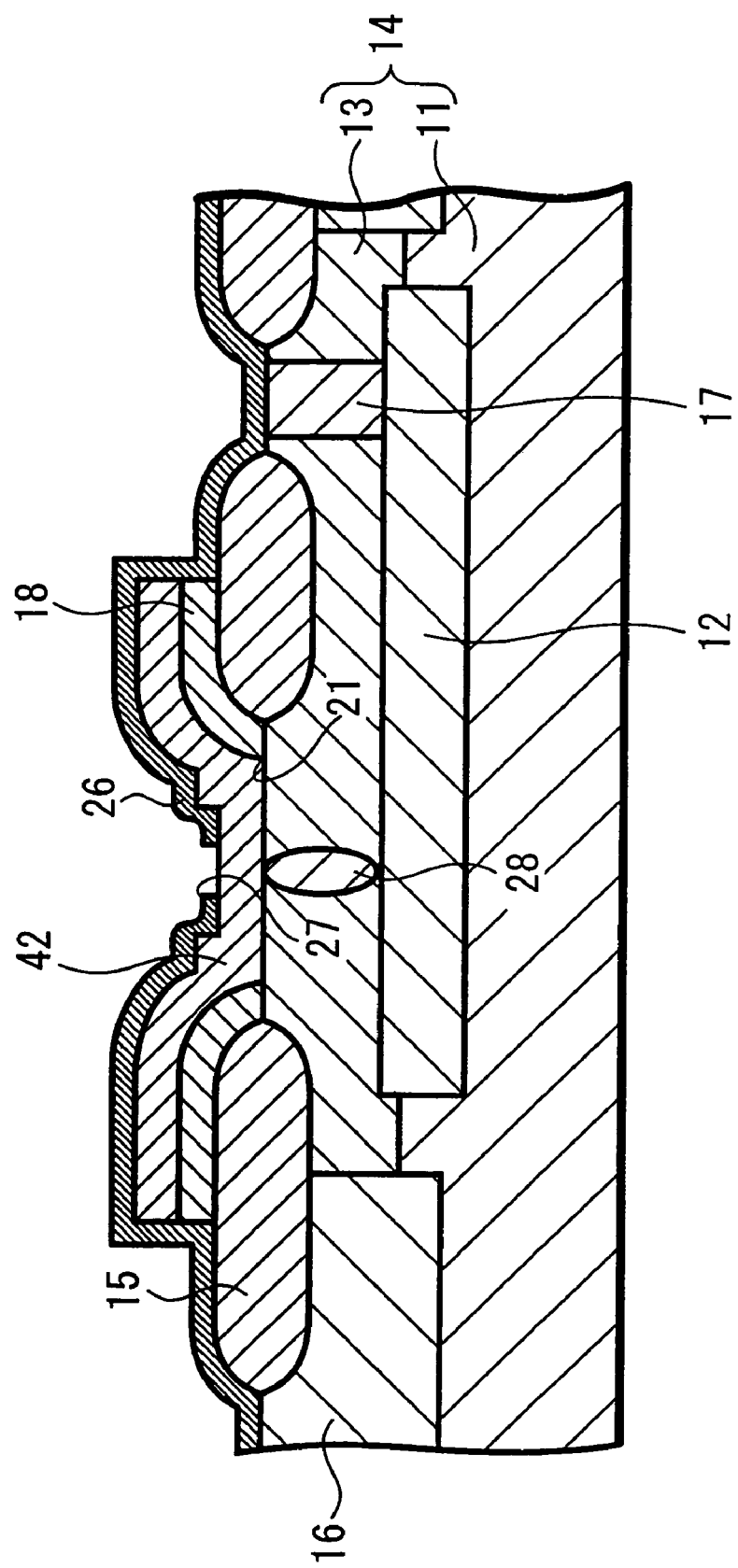
FIG. 14 is a manufacturing process diagram showing a manufacturing method of a semiconductor device according to an embodiment of the present invention (No. 7)

Next, as shown in FIG. 14, an SiO$_2$ film 26 is deposited as an insulating film by a CVD method and the SiO$_2$ film 26 is made dense by a heat treatment. Then, an opening 27 corresponding to the emitter forming region is formed on the SiO$_2$ film 26 by the lithography and the RIE. Thereafter, while the resist on the SiO$_2$ film 26 is being used as the mask, a region 28 that is used to cancel impurities on the collector side out from impurities of the base is formed under the opening 27 by implanting ions of phosphor into the epitaxial layer 13. Then, the resist is removed from the SiO$_2$ film 26.

Figure 15:
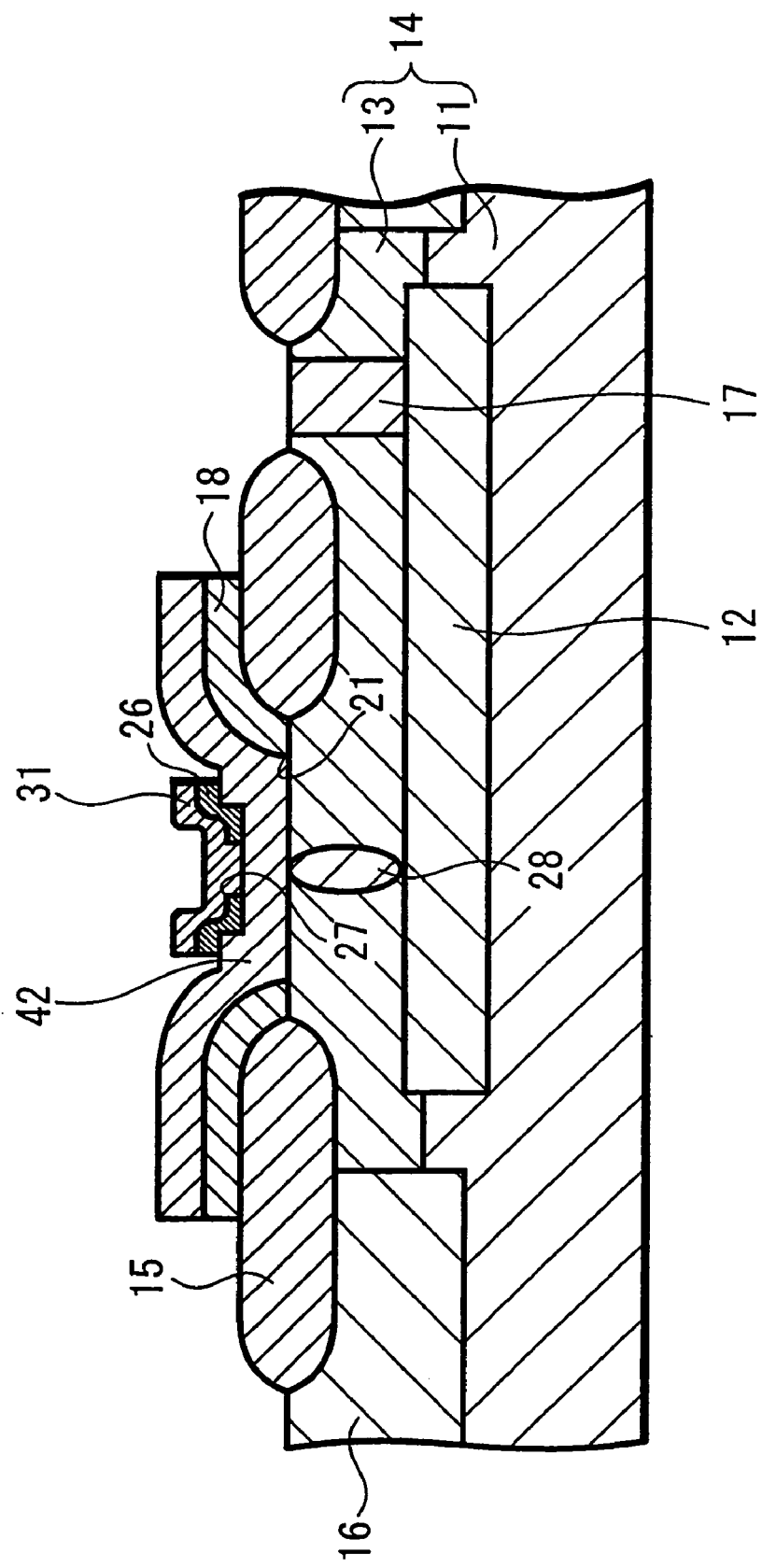
FIG. 15 is a manufacturing process diagram showing a manufacturing method of a semiconductor device according to an embodiment of the present invention (No. 8)

Next, as shown in FIG. 15, a polycrystal Si film 31 that may function as a conductive film and an impurity diffusion source is deposited by the CVD method, and ions of arsenic are implanted into this polycrystal Si film 31. Then, by the lithography and the RIE, the polycrystal Si film 31 and the SiO$_2$ film 26 are successively processed so as to have emitter electrode patterns, and a laminated film 42 is exposed. Thereafter, while the resist on the polycrystal Si film 31 is being used as a mask, ions of B that is used to decrease a resistance on the part of the base deriving electrode are implanted into the laminated film 42. Then, the resist is removed from the polycrystal Si film 31.

Figure 16:
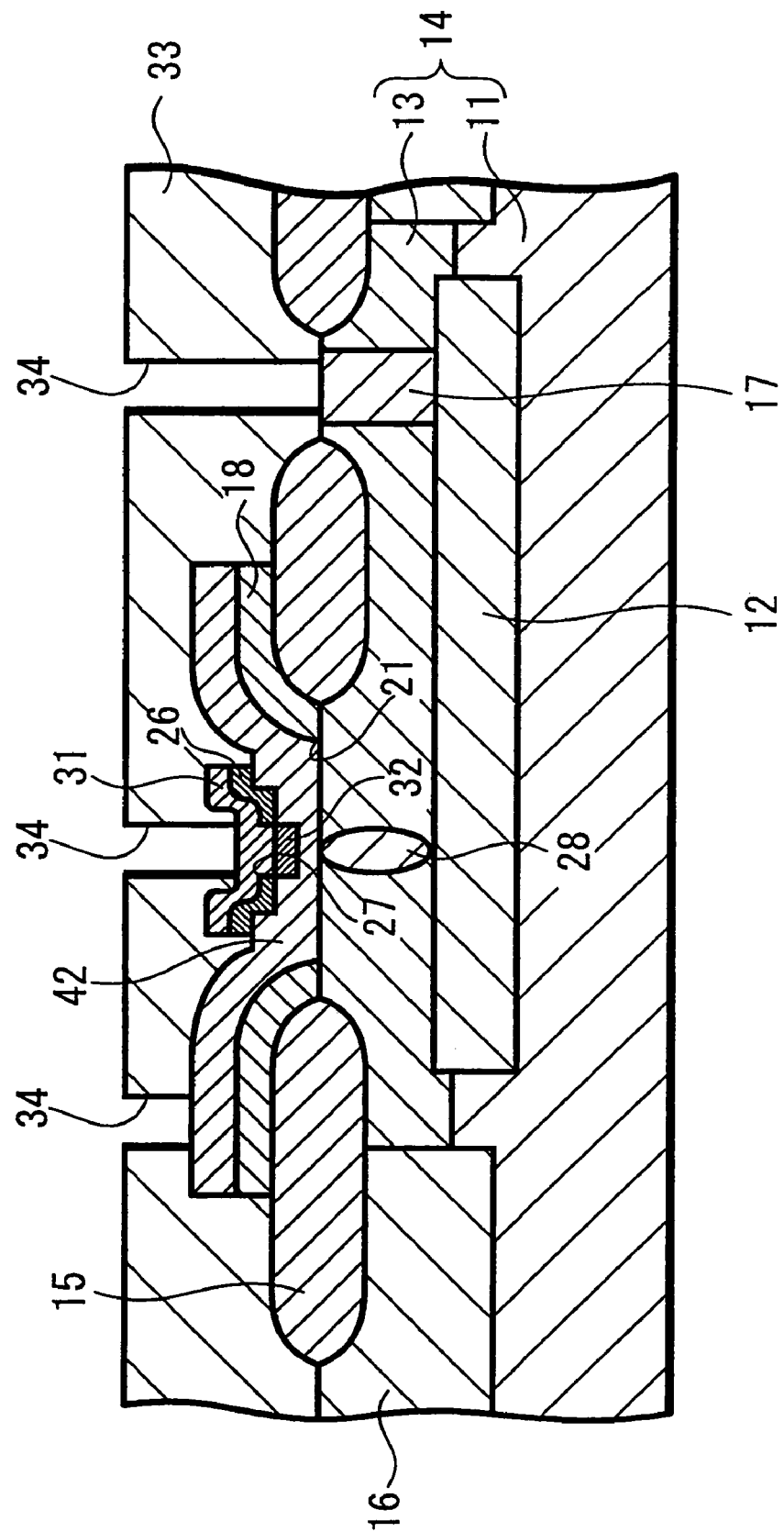
FIG. 16 is a manufacturing process diagram showing a manufacturing method of a semiconductor device according to an embodiment of the present invention (No. 9)

Next, as shown in FIG. 16, ions of impurities that have been implanted into the SIC region 28, the polycrystal Si film 31 and the laminated film 42 are activated by a heat treatment, and an N$^+$ region 32 is formed as an emitter by diffusing arsenic into the Si film 24 of the laminated film 42 from the polycrystal Si film 31 through the opening 27. Then, an SiO$_2$ film 33 is deposited as an interlayer insulator by the CVD method, and a interconnection hole 34 that reaches the polycrystal Si film 31, the laminated film 42 and the N$^+$ region 17 is formed on the SiO$_2$ film 33 by the lithography and the RIE.

Figure 17:
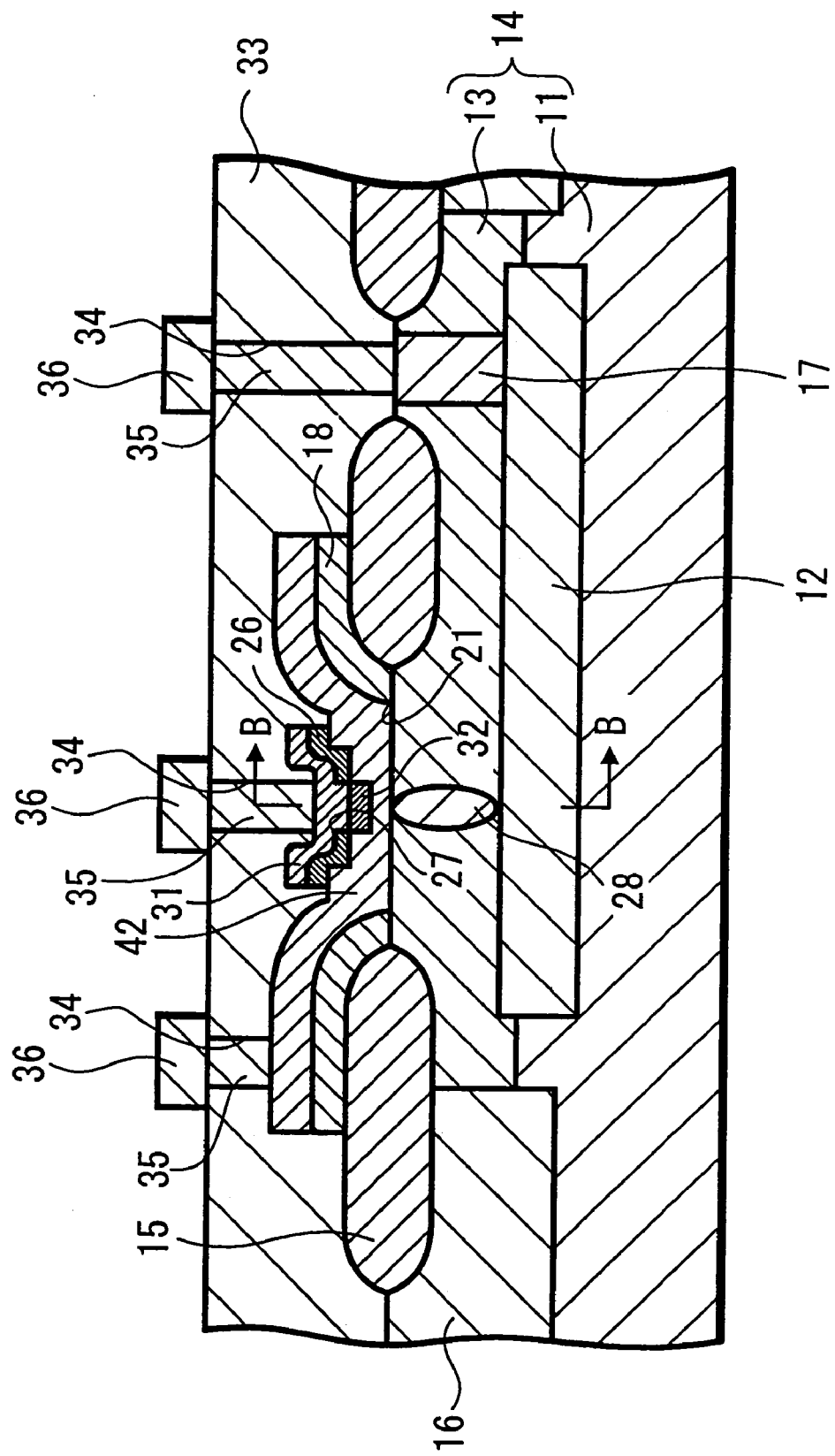
FIG. 17 is a manufacturing process diagram showing a manufacturing method of a semiconductor device according to an embodiment of the present invention (No. 10)
Figure 21:
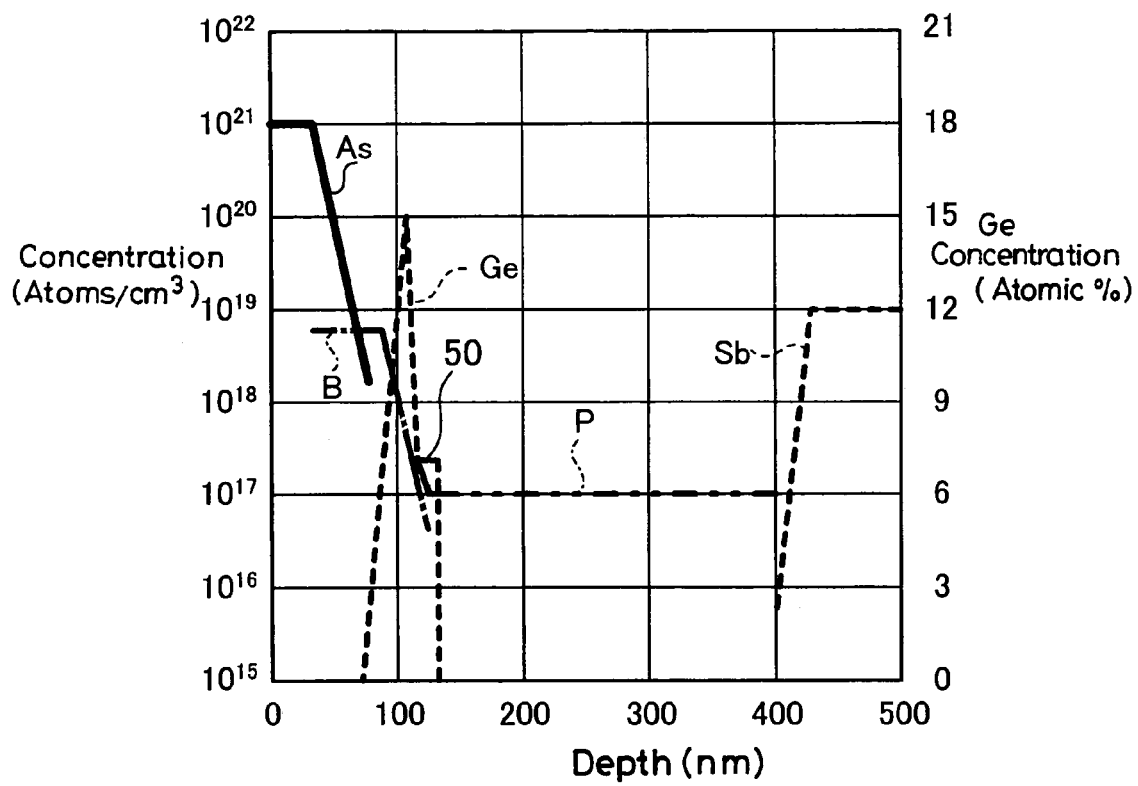
FIG. 21 is a graph showing concentration distributions of various kinds of impurities and Ge in the depth direction of a semiconductor device according to an embodiment of the present invention.

Next, as shown in FIG. 17, the interconnection hole 34 is filled with a plug 35 made of tungsten, for example, by a combination of a blanket CVD method and etching or a selective CVD method. Then, an Al alloy film 36, for example is deposited by a sputtering method, for example, and the Al alloy film 36 is processed so as to have an emitter electrode interconnection pattern, a base electrode interconnection pattern and a collector electrode interconnection pattern by the lithography and the RIE. In this manner, a desired NPN type hetero-junction bipolar transistor shown in FIG. 17 is manufactured. FIG. 21 shows concentration distributions of various kinds of impurities and Ge in the depth direction from the polycrystal Si film 31 to the N+ region 12 of this hetero-junction bipolar transistor, i.e., concentration distributions taken along the line B—B in FIG. 17. A portion 50 that is shown on the right-hand side of the peak of the Ge concentration distribution curve in FIG. 21 corresponds to the SiGe film 41.

Figure 22:
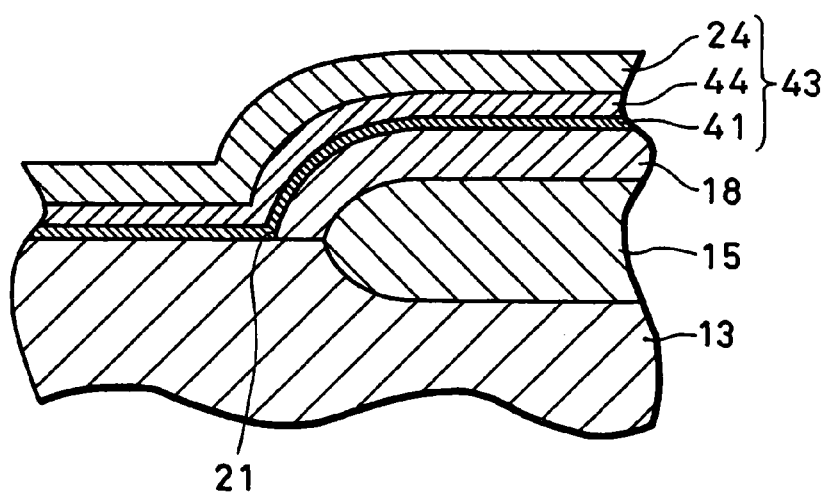
FIG. 22 is a cross-sectional view of a main portion showing a semiconductor device according to another embodiment of the present invention.

FIG. 22 is a cross-sectional view of a main portion of a hetero-junction bipolar transistor according to another embodiment of the present invention. This hetero-junction bipolar transistor comprises an SiGe film 44 instead of the SiGeC film 23 in the aforementioned embodiment shown in FIGS. 17 and 19 and a laminated film 43 composed of an SiGe film 41, an SiGe film 44 and the Si film 24. A rest of arrangement is similar to that of FIGS. 17 and 19.

FIG. 23 shows stresses occurred in the hetero-junction bipolar transistor according to the third reference example shown in FIG. 6 and stresses occurred in the hetero-junction bipolar transistor according to this embodiment of FIG. 22. The SiGe film 44 in the laminated film 43 is formed by omitting the addition of $SiCH_6$ gas from the taw material gas of the SiGeC film 23.

Figure 23A:
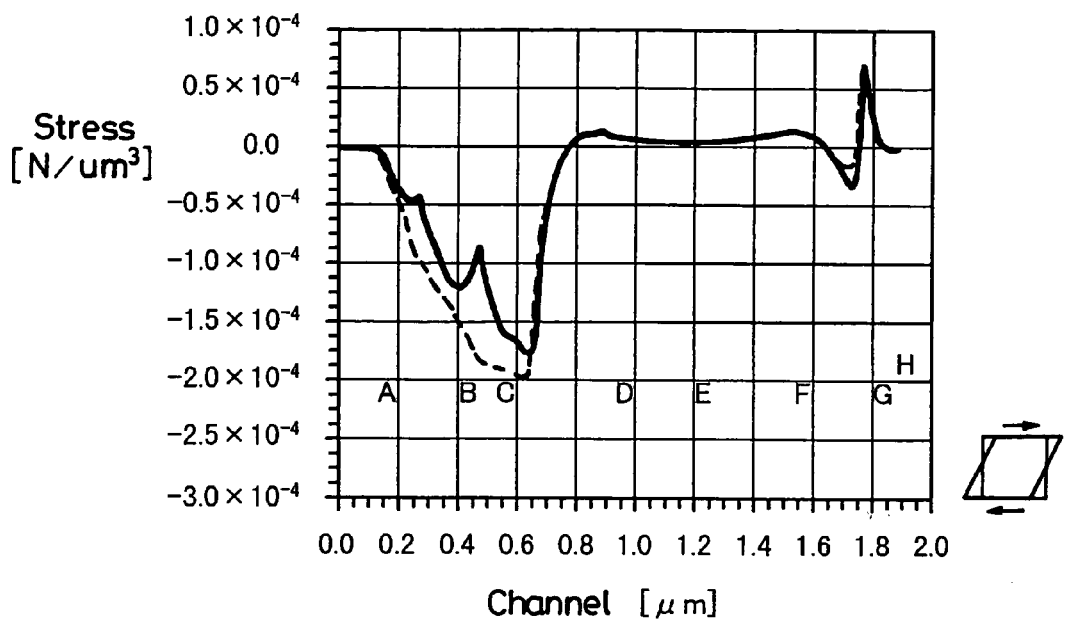
FIG. 23A is a graph of stresses occurred at the positions extending along the channels of the semiconductor devices according to the embodiments of the present invention and the reference examples.
Figure 23B:
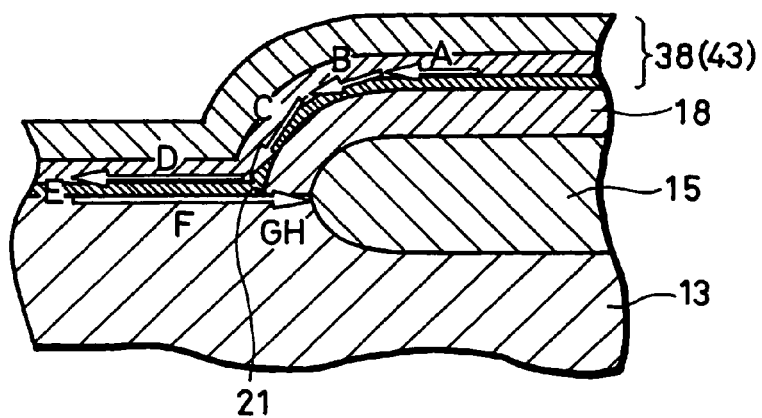
FIG. 23B is a partial cross-sectional view of the semiconductor device and illustrates the channels in FIG. 23A.

A portion extending from a point A to a point H in FIG. 23B show a channel along which stresses were obtained. FIG. 23A shows stresses that have been obtained along this channel. As shown in FIG. 23A, a stress has a positive peak near the boundary between the points F and G that are near the end edges of the opening 21 in the $SiO_2$ film 18. However, while a stress in the third reference example is approximately $0.65 \times 10^{-4}$ [N/$\mu m^2$], a stress in this embodiment is approximately $0.58 \times 10^{-4}$ [N/$\mu m^2$], and hence a stress of about 11% can be decreased.

Also at the points B, C in the portion of the polycrystal film on the $SiO_2$ film 18 in the laminated films 38, 43, stresses are decreased in this embodiment as compared with the third reference example. On the other hand, from data from the points D to F, it is to be understood that stress at the interface between the Si substrate 14 and the laminated films 38, 43 is almost zero. As described above, FIG. 23 shows stresses in the laminated film 43. However, since the stresses occurred in the laminated films 42, 43 are considerably affected by the polycrystal SiGe film 41 that adjoins the $SiO_2$ film 18, it may be considered that similar results to those of the laminated film 43 are obtained in the laminated film 42.

Figure 24:
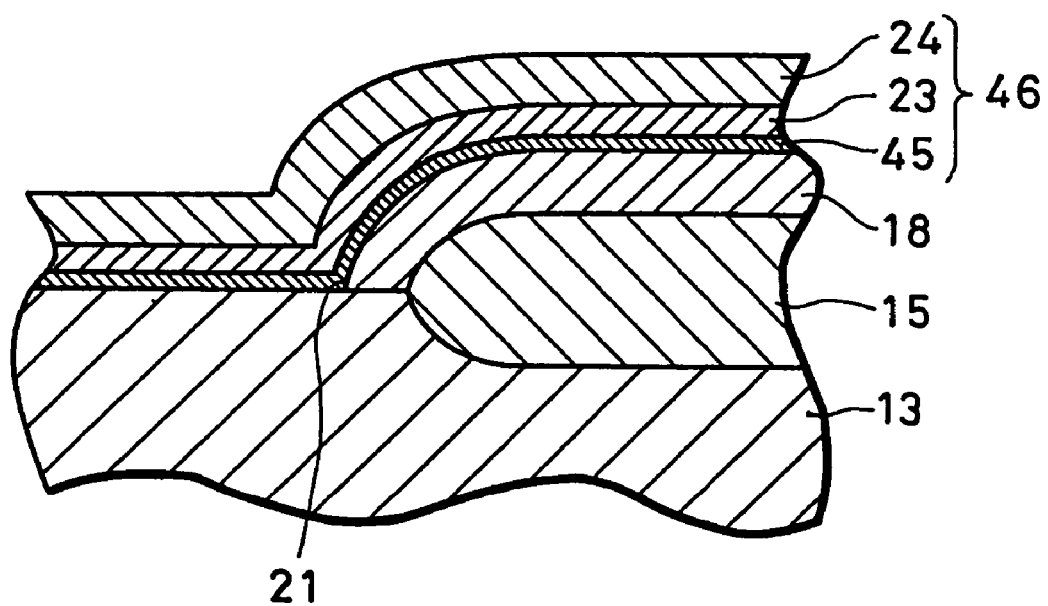
FIG. 24 is a cross-sectional view of a main portion showing a semiconductor device according to other embodiment of the present invention.

Accordingly, in the above-mentioned hetero-junction bipolar transistor that uses the laminated films 42, 43 as the hetero-junction base layer and the base deriving electrode, the occurrence of the misfit dislocation in the hetero-junction base layer can be suppressed, and hence the hetero-junction bipolar transistor can be manufactured at a high yield. While the SiGe film 41 is used in the laminated film in the above-mentioned embodiment shown in FIGS. 17 and 19, the present invention is not limited thereto, and as shown in FIG. 24, an SiGeC film 45 may be used instead of the SiGe film 41 and a laminated film 46 can be composed of the SiGeC film 45, the SiGeC film 23 and the Si film 24 to form the hetero-junction bipolar transistor. A rest of arrangement is similar to that of FIGS. 17 and 19. This embodiment of FIG. 24 can achieve similar effects to those of the above-mentioned embodiment.

While the present-invention is applied to the NPN type hetero-junction bipolar transistor and the manufacturing method thereof as set forth above, the present invention is not limited thereto and can also be applied to a PNP type hetero-junction bipolar transistor and a manufacturing method thereof. In that case, N-type impurities are introduced into the SiGeC film 23 and the Si film 24, the SiGeC film 44 and the Si film 24. Moreover, the present invention can also be applied to semiconductor devices containing the hetero-junction bipolar transistor and other semiconductor elements and manufacturing methods thereof.

While the laminated films 42, 43, 46 are used as the base layer and the deriving electrodes of the hetero-junction bipolar transistor as set forth above, the laminated films 42, 43, 46 may be applied to other use, and the Si film 24 may not always be contained in the laminated films 42, 43, 46 depending upon the use. Furthermore, while the laminated films 42, 43, 46 are formed by the CVD method as described above, they may be formed by other vapor phase growth method than the CVD method and other forming method than the vapor phase growth method, for example, a liquid phase growth method.

The invention claimed is:

1. A semiconductor layer comprising:
   a single crystal silicon substrate exposed through an insulating film;
   a first SiGe film or a first SiGeC film formed on said single crystal silicon substrate and said insulating film and having a Ge concentration which thermal expansion coefficient is equal to or becomes close to that of said insulating film, and a second SiGe film or a second SiGeC film formed on said first SiGe film or said first SiGeC film-and having a Ge concentration different from that of said first SiGe film or said first SiGeC film.

2. A semiconductor layer according to claim 1, wherein said insulating film is an oxide film.

3. A semiconductor layer according to claim 1, wherein said second SiGe film or said second SiGeC film contains P-type or N-type impurities.

4. A semiconductor layer according to claim 1, wherein said Ge concentration in said first SiGe film or said first SiGeC film is made constant in the film thickness direction in a range of from 4 to 10 atomic %.

5. A semiconductor layer according to claim 4, wherein said Ge concentration is 7.75 atomic %.

6. A semiconductor layer according to claim 1, wherein said single crystal first SiGe film or said single crystal first SiGeC film has a thickness ranging of from 5 to 30 nm.

7. A semiconductor layer according to claim 6, wherein said single crystal first SiGe film or said first SiGeC film has a thickness of approximately 15 nm.

8. A semiconductor layer forming method comprising:
   forming an insulating film on a single crystal silicon substrate;
   forming hole through which said single crystal silicon substrate is exposed;
   forming, on said single crystal silicon substrate and said insulating film, a first SiGe film or a first SiGeC film containing Ge having a concentration in which a thermal expansion coefficient is equal to or becomes close to that of said insulating film;
   forming, on the first film, a second SiGe film or a second SiGeC film having a Ge concentration different from that of said first SiGe film or said first SiGeC film.

9. A semiconductor layer forming method according to claim 8, wherein said insulating film is an oxide film.

10. A semiconductor layer forming method according to claim 8, wherein said second SiGe film or said second SiGeC film has P-type or N-type impurities introduced thereinto.

11. A semiconductor layer forming method according to claim 8, further comprising the steps of using monosilane (SiH4) gas as a raw material of silicon, germanium (GeH4)

gas as a raw material of germanium and methyl silane (SiCH6) gas as a raw material of carbon, respectively.

12. A semiconductor layer forming method according to claim 8, wherein said first SiGe film or said first SiGeC film is formed at a temperature ranging of from 600 to 750° C. by a vapor phase growth method.

13. A semiconductor layer forming method according to claim 8, wherein said Ge concentration in said first SiGe film or said first SiGeC film is made constant in the film thickness direction in a range of from 4 to 10 atomic %.

14. A semiconductor layer forming method according to claim 13, wherein said Ge concentration is 7.75 atomic %.

15. A semiconductor layer forming method according to claim 8, wherein said single crystal first SiGe film or said single crystal first SiGeC film has a thickness ranging of from 5 to 30 nm.

16. A semiconductor layer forming method according to claim 15, wherein said single crystal first SiGe film or said first SiGeC film has a thickness of approximately 15 nm.

17. A semiconductor device comprising:
   a single crystal silicon substrate exposed through an opening of an insulating film that prescribes a base forming region of a bipolar transistor;
   a first SiGe film or a first SiGeC film formed on said single crystal silicon substrate and said insulating film, said first film having Ge of which the concentration is equal to or becomes close to a thermal expansion coefficient of said insulating film; and
   a second SiGe film or a second SiGeC film formed on said first SiGe film or said first SiGeC film and having a Ge concentration different from that of said first SiGe film or said first SiGeC film.

18. A semiconductor device according to claim 17, wherein said second SiGe film or said second SiGeC film contains P-type or N-type impurities.

19. A semiconductor device according to claim 17, wherein said Ge concentration in said first SiGe film or said first SiGeC film is made constant in the film thickness direction in a range of from 4 to 10 atomic %.

20. A semiconductor device according to claim 17, wherein said single crystal SiGe film or said single crystal SiGeC film has a thickness ranging of from 5 to 30 nm.

21. A semiconductor device manufacturing method comprising:
   forming an insulating film on a single crystal silicon substrate;
   forming a hole through which said single crystal silicon substrate is exposed
   forming, on said single crystal silicon subtrate and said insulating film, a first SiGe film or a first SiGeC film having Ge of which the concentration is equal to or becomes close to a thermal expansion coefficient of said insulating film; and
   forming, on the first film, a second SiGe film or a second SiGeC film having a Ge concentration different from that of said first SiGe film or said first SiGeC film.

22. A semiconductor device manufacturing method according to claim 21, wherein said second SiGe film or said second SiGeC film has P-type or N-type impurities introduced thereinto.

23. A semiconductor device according to claim 21, further comprising the process for using monosilane (SiH4) gas as a raw material of silicon, germanium (GeH4) gas as a raw material of germanium and methyl silane (SiCH6) gas as a raw material of carbon, respectively.

24. A semiconductor device manufacturing method according to claim 21, wherein said first SiGe film or said first SiGeC film is deposited at a temperature ranging of from 600 to 750° C. by a vapor phase growth method.

25. A semiconductor device manufacturing method according to claim 21, wherein said Ge concentration in said first SiGe film or said first SiGeC film is made constant in the film thickness direction in a range of from 4 to 10 atomic %.

26. A semiconductor device manufacturing method according to claim 21, wherein said single crystal SiGe film or said single crystal first SiGeC film has a thickness ranging of from 5 to 30 nm.

* * * * *